US012795873B2

(12) United States Patent
Horiba et al.

(10) Patent No.: US 12,795,873 B2
(45) Date of Patent: Nov. 10, 2026

(54) CIRCUIT ASSEMBLY

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Issei Horiba, Osaka (JP); Yuki Fujimura, Osaka (JP); Hitoshi Takeda, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 318 days.

(21) Appl. No.: 18/562,557

(22) PCT Filed: Jun. 7, 2022

(86) PCT No.: PCT/JP2022/022876
§ 371 (c)(1),
(2) Date: Nov. 20, 2023

(87) PCT Pub. No.: WO2022/260023
PCT Pub. Date: Dec. 15, 2022

(65) Prior Publication Data

US 2024/0244804 A1 Jul. 18, 2024

(30) Foreign Application Priority Data

Jun. 11, 2021 (JP) ................................ 2021-098111

(51) Int. Cl.
*H05K 7/20* (2006.01)
*H05K 5/02* (2006.01)

(52) U.S. Cl.
CPC ........... *H05K 7/209* (2013.01); *H05K 5/0209* (2022.08); *H05K 5/0214* (2022.08); *H05K 7/20409* (2013.01)

(58) Field of Classification Search
CPC .... H05K 7/209; H05K 5/0214; H05K 5/0209; H05K 7/20409
(Continued)

(56) References Cited

U.S. PATENT DOCUMENTS 3,909,679 A * 9/1975 Petri ......................... G07F 9/10 361/709
4,039,900 A * 8/1977 Roback .................. H05K 7/209 361/836
(Continued)

FOREIGN PATENT DOCUMENTS

JP 2004-247561 9/2004
JP 2005-294741 10/2005
(Continued)

OTHER PUBLICATIONS

International Search Report issued in WIPO Patent Application No. PCT/JP2022/022876, dated Sep. 6, 2022, along with an English translation thereof.

*Primary Examiner* — Anatoly Vortman
(74) *Attorney, Agent, or Firm* — Greenblum & Bernstein, P.L.C.

(57) ABSTRACT

A circuit assembly that dissipates heat with improved efficiency compared to a conventional structure while securing waterproofing is disclosed. The circuit assembly includes a case including an opening hole in a bottom portion thereof, a heat generating component that is housed inside the case, is exposed to the outside from the opening hole, and is in
(Continued)

thermal contact with an external heat dissipator, and an annular sealing member that is disposed at a peripheral edge portion of the opening hole and is interposed between the case and an attached member that is attached to the case.

8 Claims, 12 Drawing Sheets

(58) Field of Classification Search
USPC .......................................................... 361/704
See application file for complete search history.

(56) References Cited

U.S. PATENT DOCUMENTS

| | | | | | |
|---|---|---|---|---|---|
| 5,392,873 | A * | 2/1995 | Masuyama | B60L 50/64 | 180/68.5 |
| 5,880,930 | A * | 3/1999 | Wheaton | H05K 7/20409 | 361/818 |
| 6,208,515 | B1 * | 3/2001 | Klein | H05K 7/1084 | 439/570 |
| 6,374,912 | B1 * | 4/2002 | LaGrotta | H05K 7/20409 | 174/559 |
| 6,404,633 | B1 * | 6/2002 | Hsu | H10W 40/611 | 248/510 |
| 6,525,941 | B1 * | 2/2003 | Lai | H10W 40/43 | 248/510 |
| 6,894,898 | B2 * | 5/2005 | Liu | H10W 40/43 | 248/510 |
| 7,120,024 | B2 * | 10/2006 | Watanabe | H05K 7/20854 | 361/720 |
| 7,133,288 | B2 * | 11/2006 | DelPrete | H10W 40/641 | 257/E23.099 |
| 7,254,034 | B2 * | 8/2007 | Bolle | H05K 7/20436 | 165/185 |
| 7,355,857 | B2 * | 4/2008 | Pirillis | H05K 9/0058 | 361/689 |
| 7,643,297 | B2 * | 1/2010 | Tominaga | B62D 5/0406 | 165/80.2 |
| 7,719,833 | B2 * | 5/2010 | Inagaki | H05K 7/20854 | 174/16.3 |
| 7,751,193 | B2 * | 7/2010 | Tominaga | H05K 7/20509 | 174/16.3 |
| 8,929,079 | B2 * | 1/2015 | Watanabe | H05K 7/20854 | 361/705 |
| 8,953,335 | B2 * | 2/2015 | Abe | H10W 40/10 | 361/728 |
| 9,480,189 | B2 * | 10/2016 | Kawai | H05K 7/20854 | |
| 9,907,192 | B2 * | 2/2018 | Shoji | H05K 7/20409 | |
| 11,109,514 | B1 * | 8/2021 | Liu | H05K 7/2049 | |
| 12,279,404 | B2 * | 4/2025 | Yamanoue | H05K 7/209 | |
| 2004/0160754 | A1 * | 8/2004 | Kobayashi | H05K 7/20854 | 361/783 |
| 2008/0009154 | A1 * | 1/2008 | Kanou | B60R 16/0239 | 439/76.2 |
| 2008/0158823 | A1 | 7/2008 | Tominaga et al. | | |
| 2013/0313929 | A1 * | 11/2013 | Naka | H02K 5/18 | 310/64 |
| 2018/0309278 | A1 * | 10/2018 | Ikeda | B60R 16/0238 | |
| 2018/0310394 | A1 * | 10/2018 | Kobayashi | H05K 1/0263 | |
| 2018/0375307 | A1 | 12/2018 | Kita | | |
| 2020/0381905 | A1 * | 12/2020 | Sasaki | H02G 3/081 | |
| 2021/0259132 | A1 * | 8/2021 | Liu | H05K 7/2049 | |
| 2022/0217865 | A1 | 7/2022 | Fujimura | | |
| 2022/0248524 | A1 | 8/2022 | Igura et al. | | |

FOREIGN PATENT DOCUMENTS

| | | |
|---|---|---|
| JP | 2008-166383 | 7/2008 |
| JP | 2017-112718 | 6/2017 |
| JP | 2018-164359 | 10/2018 |
| JP | 2020-184564 | 11/2020 |
| JP | 2021-015959 | 2/2021 |

* cited by examiner

CIRCUIT ASSEMBLY

TECHNICAL FIELD

The present disclosure relates to a circuit assembly.

BACKGROUND ART

A conventional circuit assembly including a heat generating component, such as a relay or fuse that generates heat when a current flows therethrough, may be provided with a heat dissipating structure to dissipate the heat produced by the heat generating component. As one example, in Patent Document 1, a connecting conductor, which is connected to the heat generating component such that heat can be transferred, contacts a metal bracket via a sheet-like heat transferring member and a base member made of synthetic resin. With this configuration, the heat produced by the heat generating component passes via the heat transferring member and the base member and is dissipated from the bracket, which results in cooling.

This type of circuit assembly is provided with a waterproof structure to prevent electrical short circuits, which also prevents water from infiltrating the inside of the circuit assembly. As this waterproof structure, in Patent Document 1 a protective wall is provided that extends upward at the outer peripheral edge of the base member.

CITATION LIST

Patent Documents

Patent Document 1: JP 2020-184564A

SUMMARY OF INVENTION

Technical Problem

However, in Patent Document 1, heat is dissipated from the heat generating component(s) via the base member, which is made of synthetic resin. This means that when the amount of generated heat is expected to be large, such as with a circuit board on which semiconductor fuses or semiconductor relays are mounted, a heat dissipating structure that can dissipate heat more efficiently may be required.

For this reason, a circuit assembly that can dissipate heat with improved efficiency compared to a conventional structure while securing waterproofing is disclosed.

Solution to Problem

A circuit assembly according to an aspect of the present disclosure includes: a case including an opening hole at a bottom thereof; a heat generating component that is housed inside the case, is exposed to the outside through the opening hole, and is in thermal contact with an external heat dissipator; and an annular sealing member that is disposed at a peripheral edge portion of the opening hole and is interposed between the case and an attached member that is attached to the case.

Advantageous Effects of Invention

According to the present disclosure, it is possible to provide a circuit assembly that can dissipate heat with improved efficiency compared to a conventional structure while securing waterproofing.

DESCRIPTION OF EMBODIMENTS

Figure 1:
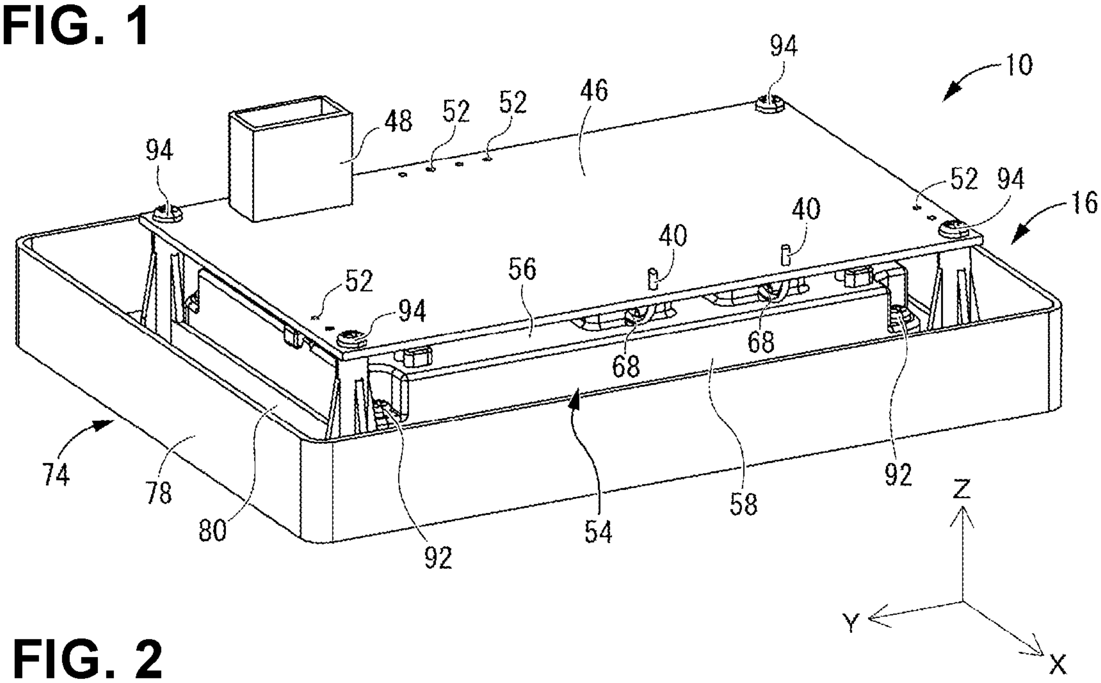
FIG. 1 is a perspective view of a circuit assembly according to a first embodiment.
Figure 2:
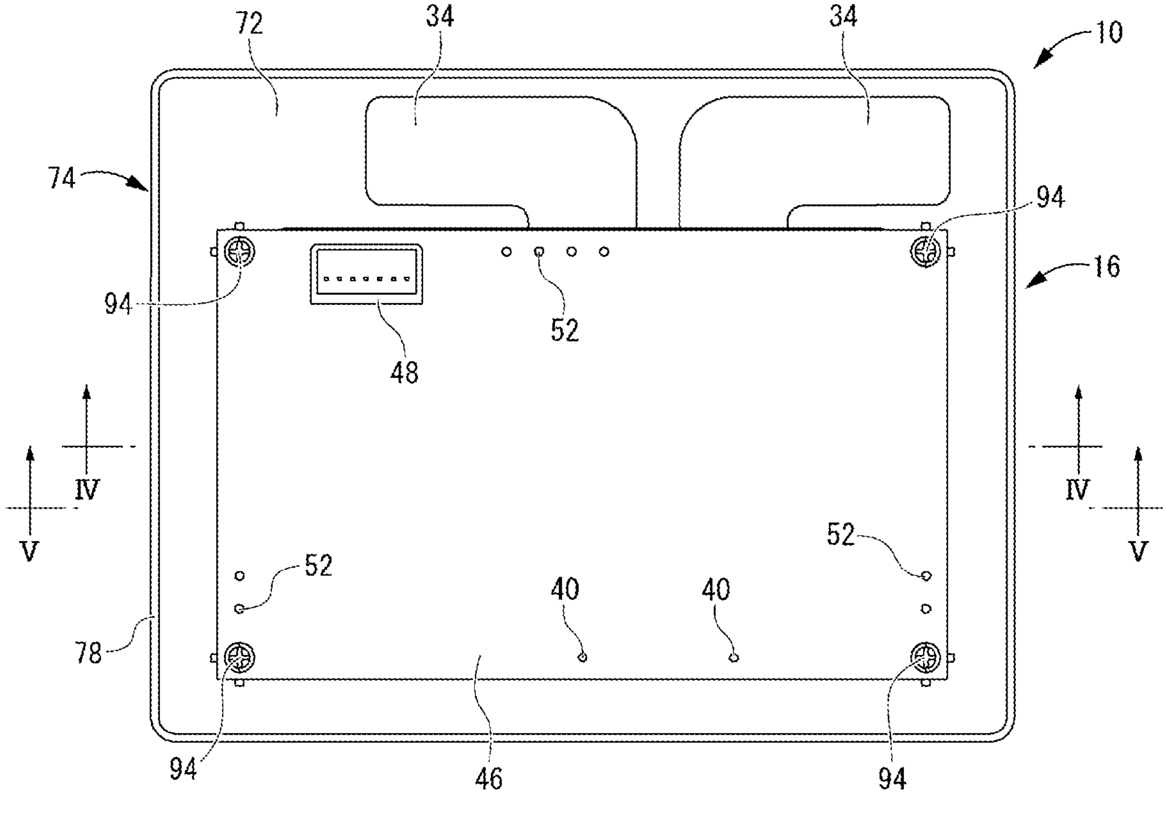
FIG. 2 is a plan view of the circuit assembly depicted in FIG. 1.

Outline of Embodiments of the Present Disclosure

First, modes for carrying out the present disclosure will be listed and described.

(1) A circuit assembly according to the present disclosure includes: a case including an opening hole at a bottom thereof, a heat generating component that is housed inside the case, is exposed to the outside through the opening hole, and is in thermal contact with an external heat dissipator; and an annular sealing member that is disposed at a peripheral edge portion of the opening hole and is interposed between the case and an attached member that is attached to the case.

According to the above configuration, an opening hole is provided in the bottom of the case, the heat generating component is exposed to the outside through this opening hole, and the heat generating component is placed in thermal contact with a heat dissipator. By doing so, it is possible to omit a member made of synthetic resin, such as the case, on a heat dissipation path that reaches the heat dissipator from the heat generating component, which improves the efficiency of heat dissipation.

An annular sealing member is provided at the peripheral edge portion of the opening hole and the sealing member is interposed between the case and the attached member that is attached to the case. By doing so, the opening hole is surrounded by the sealing member that is interposed between the case and the attached member, which prevents infiltration of water into the case from outside the case through the opening hole and maintains the waterproofing of the circuit assembly. Note that as described later, the attached member that is attached to the case and acts in concert with the case to sandwich the sealing member may be the heat generating component or may be a different member to the heat generating component, such as a heat dissipating plate, that is composed of a material with higher thermal conductivity than the case.

(2) It is preferable for the attached member to be composed of the heat generating component, and for at least part of the sealing member disposed on the peripheral edge portion of the opening hole in the case to be interposed between a flange, which protrudes from an outer peripheral edge of the heat generating component, and the peripheral edge portion of the opening hole.

The flange protrudes from the outer peripheral edge of the heat generating component, and at least part of the sealing member is interposed between the flange and the peripheral edge portion of the opening hole to form a planar seal. With this configuration, by merely providing the flange, it is possible to stably provide a region for sandwiching the sealing member, so that the sandwiching of the sealing member and the maintaining of the waterproofing are achieved more reliably. In particular, since the shape of the flange can be freely set in keeping with the shape of the peripheral edge portion of the opening hole in which the sealing member is disposed, it is possible to achieve reliable waterproofing with a high degree of design freedom. As one example, it is possible to use a flange shape where the entire area of the sealing member is sandwiched between the flange and the peripheral edge portion of the opening hole, or a flange shape where the entire range of the sealing member is sandwiched between the peripheral edge portion of the opening hole and a combination of the flange and an outer peripheral edge of the heat generating component.

(3) The heat generating component is preferably in contact with the external heat dissipator directly or via only a thermally conductive member. Since the heat generating component is in contact with the heat dissipator directly or via only a thermally conductive member, the heat of the heat generating component is directly dissipated by the heat dissipator, which improves the efficiency of heat dissipation. Note that in order for the heat generating component to contact the heat dissipator directly or via only the thermally conductive member, a contact protrusion that passes through the opening hole and contacts the heat dissipator may be provided on the heat generating component or a contact protrusion that passes through the opening hole and contacts the heat generating component inside the case may also be provided on the heat dissipator. Note that when a thermally conductive member is interposed, the thermally conductive member may be composed of a conventionally known thermally conductive sheet or a gap filler.

(4) It is preferable for the circuit assembly to further include a heat dissipating plate that covers the opening hole and is made of a material with higher thermal conductivity than the case, for the heat generating component to be mounted in thermal contact with an inner surface of the heat dissipating plate, and for an outer surface of the heat dissipating plate to be in thermal contact with the external heat dissipator. A heat dissipating plate made of a material with higher thermal conductivity than the case is provided on a heat dissipation path from the heat generating component to the heat dissipator. This means that the efficiency of heat dissipation is improved compared to a conventional structure where the case is provided on the heat dissipation path. Note that although the material of the heat dissipating plate is selected with consideration to strength, weight, cost, and the like, it is preferable to use a metal with superior thermal conductivity and in particular aluminum or aluminum alloy.

(5) It is preferable for the attached member to be composed of the heat dissipating plate, for a housing groove for housing the sealing member to be formed in the inner surface of the heat dissipating plate, and for the sealing member to be interposed between the heat dissipating plate and a bottom surface of the case, which is mounted on the housing groove. Providing the heat dissipating plate achieves favorable dissipation of heat, and since the sealing member is interposed between the heat dissipating plate and the case, the waterproofing of the circuit assembly is also maintained.

(6) It is preferable for the attached member to be composed of the heat dissipating plate, for the case and the heat dissipating plate to be integrally formed, and for the sealing member interposed between the peripheral edge portion of the opening hole in the case and the heat dissipating plate to be provided by a dissimilar bonding material. Since the case and the heat dissipating plate are integrally formed, the task of attaching the case and the heat dissipating plate and the bolts for assembly can be omitted, and the number of parts when assembling the circuit assembly can also be reduced. A dissimilar bonding material is provided between the case and the heat dissipating plate, and as one example, a case made of synthetic resin and a heat dissipating plate made of metal can be bonded together. With this configuration, gaps that are caused to be generated by sink marks during the molding of the case, differences in the coefficient of linear expansion, and the like are not generated between the case and the heat dissipating plate, which maintains the waterproofing of the circuit assembly more reliably.

(7) It is preferable for the attached member to be composed of the heat dissipating plate, for the heat dissipating plate to include a protruding portion that protrudes toward the heat generating component, for the case to include a cylindrical wall portion disposed on an outside of an outer peripheral surface of the protruding portion, and for the sealing member to be interposed between an inner peripheral surface of the cylindrical wall portion and an outer peripheral surface of the protruding portion that are disposed facing each other in a radial direction of the cylindrical wall portion. Providing the heat dissipating plate ensures favorable dissipation of heat, and the seal member is interposed between the protruding portion of the heat dissipating plate and the cylindrical wall portion of the case to form a shaft seal, which maintains the waterproofing of the circuit assembly.

(8) It is preferable for an annular flange to protrude on an outer peripheral edge of the heat generating component, and for the annular flange to be interposed between the peripheral edge portion of the opening hole and the protruding portion of the heat dissipating plate. An annular flange protrudes from the outer peripheral edge of the heat generating component, and this annular flange is interposed between the peripheral edge portion of the opening hole and the protruding portion of the heat dissipating plate. That is, the heat generating component and the case can be assembled so that the annular flange and the peripheral edge portion of the opening hole engage each other, which makes it possible to position the heat generating component on the case when assembling the heat generating component and the case. It is also possible to eliminate the task of assembling the heat generating component and the case and the bolts used for assembly.

(9) It is preferable for the circuit assembly to further include an insulating member that covers the heat generating component from above, and for the insulating member to be attached to the case so that the insulating member prevents separation of the heat generating component from the heat dissipator. The insulating member prevents the heat generating component from separating from the heat dissipator, and by suppressing the generation of gaps between the heat generating component and the heat dissipator or between the heat generating component and the heat dissipating plate, it is possible to stably maintain the efficiency of heat dissipation.

Detailed Description of Embodiments of the Present Disclosure

Specific examples of a circuit assembly according to the present disclosure are described below with reference to the drawings. Note that the present disclosure is not limited to these embodiments, is indicated by the range of the patent claims, and is intended to include all modifications within the meaning and scope of the patent claims and their equivalents.

First Embodiment

A circuit assembly 10 according to a first embodiment of the present disclosure is described below with reference to FIGS. 1 to 5. The circuit assembly 10 according to the first embodiment is mounted in a vehicle (not illustrated) such as an electric vehicle or a hybrid vehicle, and supplies and controls electric power from a power source, such as a battery (not illustrated) to a load, such as a motor (not illustrated). Although the circuit assembly 10 can be disposed in any orientation, the following description assumes that the X direction in FIG. 1 is forward, the Y direction is leftward, and the Z direction is upward. In cases where a plurality of members are the same, only some of such members may be assigned reference numerals and the reference numerals of other members may be omitted.

Circuit Assembly 10

Figure 3:
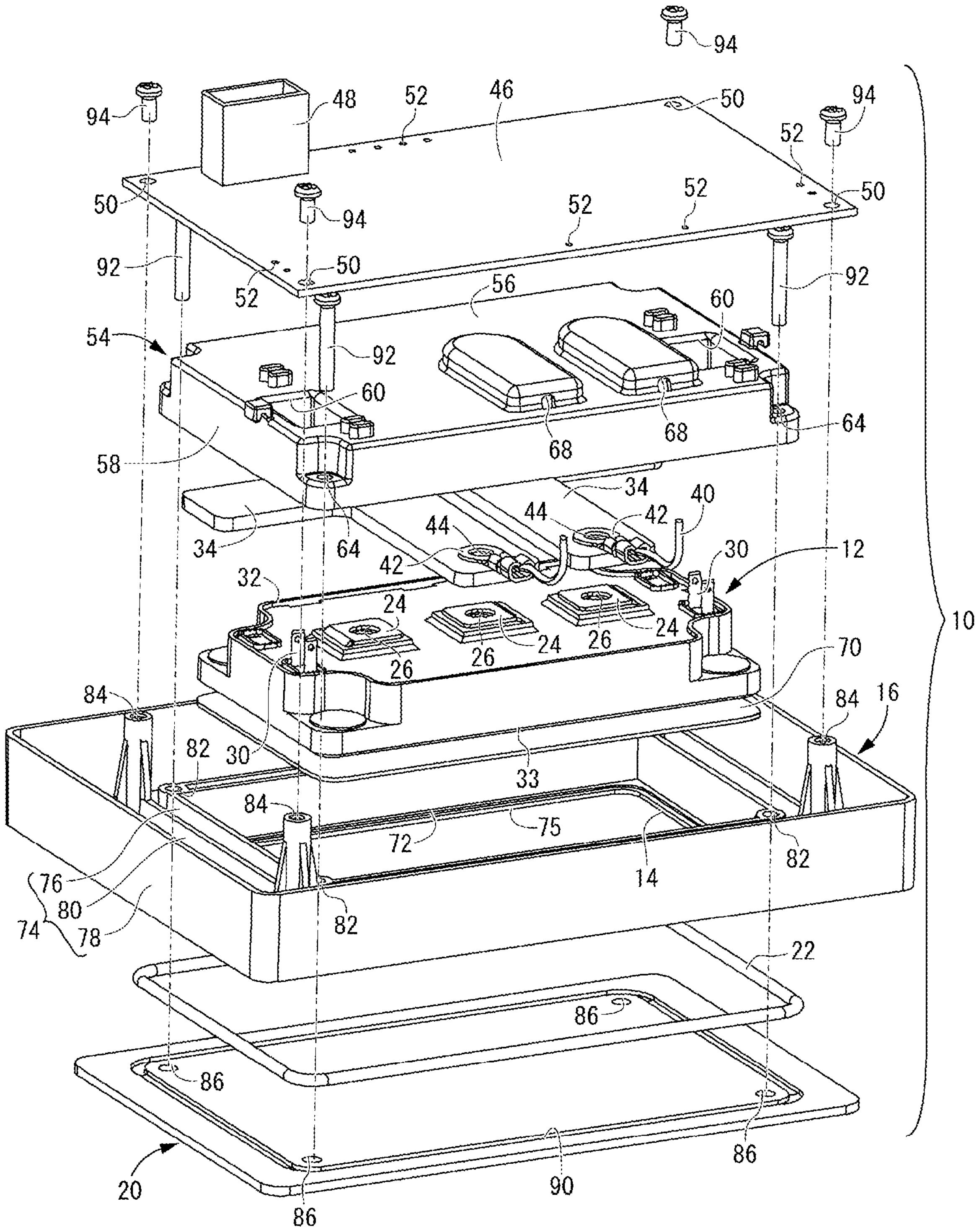
FIG. 3 is an exploded perspective view of the circuit assembly depicted in FIG. 1.
Figure 4:
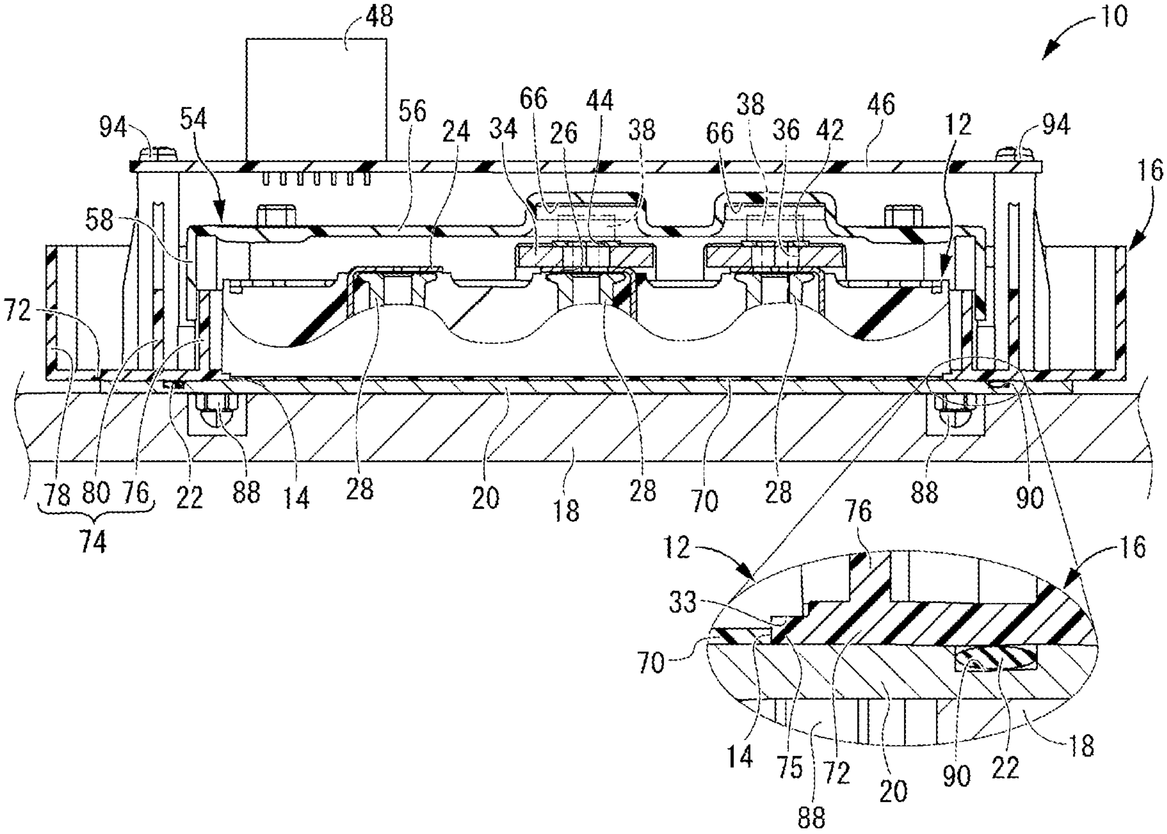
FIG. 4 is a cross-sectional view taken along IV-IV in FIG. 2.
Figure 5:
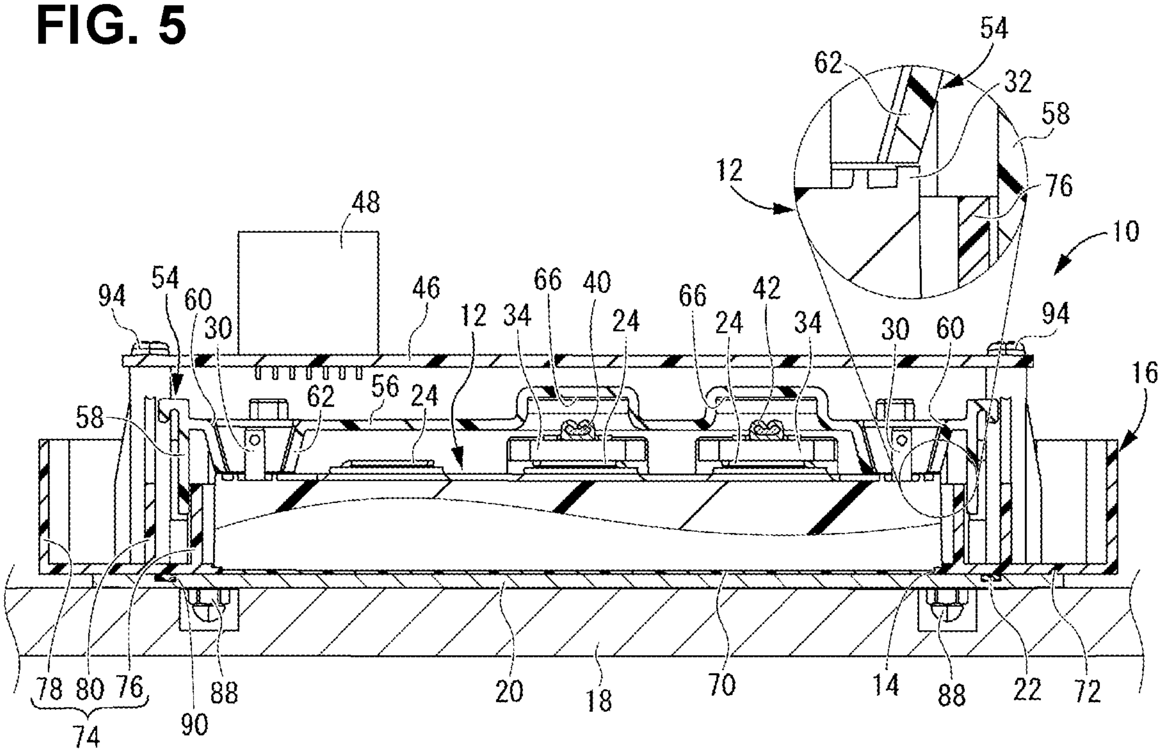
FIG. 5 is a cross-sectional view taken along V-V in FIG. 2.

As depicted in FIGS. 3 to 5, the circuit assembly 10 includes a semiconductor module 12 as a heat generating component that generates heat when power is supplied. The circuit assembly 10 also includes a case 16 that has an opening hole 14 in a bottom portion thereof, with the opening hole 14 being formed so as to pass through the bottom portion of the case 16 in the vertical direction. The semiconductor module 12 is housed inside the case 16, with the semiconductor module 12 exposed to the outside through the opening hole 14 and in thermal contact with a housing 18 of a battery pack. The housing 18 is made of metal and acts as an external heat dissipator. The circuit assembly 10 additionally includes, at a peripheral edge portion of the opening hole 14, an annular sealing member 22 that is interposed between the case 16 and an attached member (in this first embodiment, as described later, a heat dissipating plate 20) that is attached to the case 16.

Semiconductor Module 12

Since a conventionally known module is used as the semiconductor module 12, detailed description thereof is omitted here. As one example, a substrate made of metal or the like, not illustrated, is provided at a bottom portion of the semiconductor module 12. Although not illustrated, semiconductor chips, switching elements, insulating plates, and the like are disposed in a predetermined order on this substrate. Terminals are connected to these semiconductor chips, switching elements, and the like, protrude upward inside the semiconductor module 12, and construct main circuit terminals 24 that are exposed to the outside at an upper end surface of the semiconductor module 12. The main circuit terminals 24 exposed to the outside of the semiconductor module 12 are each provided with a bolt hole 26, with nuts 28 that communicate with the bolt holes 26 of the main circuit terminals 24 being provided inside the semiconductor module 12. In this first embodiment, three main circuit terminals 24 and nuts 28 are provided at predetermined intervals in the left right direction. On the semiconductor module 12, control terminals 30 that are connected to the semiconductor chips, switching elements, and the like disposed inside the semiconductor module 12 are provided at both ends in the left-right direction so as to protrude upward from the semiconductor module 12.

The semiconductor module 12 according to the first embodiment has an overall shape that approximates to a rectangular block, and is a molded product made of an electrically insulating synthetic resin. This means that parts of the semiconductor module 12 aside from the terminals, chips, nuts, and the like are filled with synthetic resin. Note that as depicted in the enlarged view in FIG. 5, in this first embodiment, an upward protrusion 32 is provided on the outer peripheral edge of the upper end surface of the semiconductor module 12 so as to protrude higher than other parts of the upper end surface. As depicted in the enlarged view in FIG. 4, a positioning recess 33 that is continuous in the circumferential direction around the entire circumference is also formed in a stepped shape on the outer peripheral edge at the lower end of the semiconductor module 12. As another example, the semiconductor module may be configured with terminals, chips, nuts, and the like disposed so as to be housed inside a hollow case made of synthetic resin.

In the semiconductor module 12, the front ends of bus bars 34 that extend in the front-rear direction are placed over the main circuit terminals 24 and are fastened with bolts 38, which are indicated in FIG. 4 by chain double-dashed lines. In more detail, bolt insertion holes 36 that pass through in the vertical direction are formed in the front ends of the bus bars 34. The bolt insertion holes 36 of the bus bars 34 and the bolt holes 26 of the main circuit terminals 24 are placed in alignment and the bolts 38 are passed through and fastened to the nuts 28. When doing so, crimped terminals 42, which have been crimped to the ends of electric wires 40 that extend from wiring patterns (not illustrated) on a control board 46, described later, are placed over the bus bars 34. The bolt insertion holes 36, the bolt holes 26, and bolt holes 44 in the crimped terminals 42 are placed in alignment, and the bolts 38 are passed through and fastened to the nuts 28 under the main circuit terminals 24. By doing so, the control board 46 connected to the electric wires 40, the bus bars 34, and the main circuit terminals 24 of the semiconductor modules 12 are electrically connected.

The control board 46, described later, to which the electric wires 40 are connected is provided above the semiconductor module 12. The electric wires 40 that extend from the crimped terminals 42 are inserted through through holes 52 provided in the control board 46, and the opposite ends of the electric wires 40 to the ends where the crimped terminals 42 are provided are connected to wiring patterns (not illustrated) on the control board 46. In addition, in this first embodiment, the bus bars 34 and the crimped terminals 42 are bolted to the middle and right main circuit terminals 24 out of the three main circuit terminals 24 aligned in the left-right direction. One bus bar 34 is the input side and the other bus bar 34 is the output side, with the rear ends of the respective bus bars 34 extending to the rear beyond the semiconductor module 12. That is, a rear end of the input-side bus bar 34 is electrically connected to a power source, not illustrated, and a rear end of the output-side bus bar 34 is electrically connected to a load, such as a motor, not illustrated.

Control Board 46

The control board 46 has an overall shape that approximates to a rectangular plate extending in the horizontal direction (that is, a direction perpendicular to the vertical direction), and as one example is made of synthetic resin or the like that is electrically insulating. A control circuit (not illustrated) including electronic components (not illustrated) such as resistors, coils, capacitors, and diodes and wiring patterns (not illustrated) that electrically connect such electronic components are provided on both upper and lower surfaces of the control board 46. The control board 46 is also provided with a connector 48 that protrudes outward (upward in the first embodiment), with this connector 48 being connected to an ECU. When the connector 48 and the ECU are connected, the ECU becomes electrically connected to the control circuit on the control board 46 via signal lines provided inside the connector 48.

Bolt insertion holes 50 that pass through in the thickness direction (that is, the vertical direction) are also provided at the four corners of the control board 46, and a plurality of through holes 52 that pass through in the thickness direction are provided at predetermined positions around the outer peripheral edge of the control board 46.

Insulating Member 54

An insulating member 54 made of an electrically insulating synthetic resin is provided between the bus bars 34 provided on the semiconductor module 12 and the control board 46 to prevent electrical short circuits due to contact between the control circuit on the control board 46 and the bus bars 34. In this first embodiment, the insulating member 54 is substantially box-like in shape and open to below, and is substantially rectangular when looking from above. That is, the insulating member 54 has an upper bottom wall portion 56, which is substantially rectangular, and a peripheral wall portion 58 that protrudes downward from the outer peripheral edge of the upper bottom wall portion 56. The insulating member 54 is formed with a size capable of covering the semiconductor module 12 from above, and is smaller than the control board 46 when looking from above. In this first embodiment in particular, when the insulating member 54 is attached to the case 16 in a state where the semiconductor module 12 is covered from above, the peripheral wall portion 58 of the insulating member 54 is positioned so that an inner peripheral wall portion 76, described later, of the case 16 becomes covered from the outside thereof.

Through holes 60 that pass through in the vertical direction are also provided in the insulating member 54 at positions that correspond to the control terminals 30 of the semiconductor module 12. As depicted in FIG. 5, a substantially cylindrical downward protrusion 62 that protrudes downward from the upper bottom wall portion 56 is provided at the peripheral edge of each through hole 60. In this first embodiment, the downward protrusions 62 have a substantially tapered cylindrical shape whose diameter gradually decreases in the downward direction. Bolt insertion holes 64 that pass through vertically are also formed at the four corners of the insulating member 54. In addition, housing recesses 66 for accommodating the bolts 38 are formed so as to open downward at portions of the insulating member 54 where the main circuit terminals 24, the bus bars 34, and the crimped terminals 42 are placed over each other and fastened with the bolts 38. Electric wire insertion holes 68 through which the electric wires 40 are inserted are formed in the thickness direction through wall portions that construct the housing recesses 66.

Thermally Conductive Sheet 70

A thermally conductive sheet 70 as a thermally conductive member is attached to the lower surface of the semiconductor module 12. The thermally conductive sheet 70 has a rectangular shape that is substantially the same as the semiconductor module 12 when looking from above, and is attached to the lower surface of the semiconductor module 12 to cover the entire lower surface of the semiconductor module 12. Since the thermally conductive sheet 70 transfers heat, is electrically insulating, and is also capable of elastic deformation, the thermally conductive sheet 70, by interposing the thermally conductive sheet 70 between the lower surface of the semiconductor module 12 and the heat dissipating plate 20 in the vertical direction, the thermally conductive sheet 70 can be held in tight contact with both members. As examples of the material of the thermally conductive sheet 70, polyethylene terephthalate (PET), polyethylene naphthalate (PEN), polytetrafluoroethylene (PTFE), polycarbonate (PC), and polyimide (PI) can be used. The thermally conductive member may be a gap filler or the like that fills the gap between the semiconductor module 12 and the heat dissipating plate 20. Note that for ease of understanding, the thickness dimension of the thermally conductive sheet 70 is exaggerated in the drawing.

Case 16

The case 16 in the first embodiment has an overall box-like shape that opens upward, and includes a bottom wall 72 and a peripheral wall 74 that protrudes upward from the outer peripheral edge of the bottom wall 72 on both sides in the front-rear direction and on both sides in the left-right direction. The case 16 is capable of internally housing the semiconductor module 12. An upper part of the case 16 may be covered with an upper case (not illustrated), with the case 16 and the upper case constructing a hollow box-like structure in which the semiconductor module 12, the insulating member 54, and the control board 46 are housed. That is, the case 16 may be a lower case of an electric connection box that houses the semiconductor module 12, the insulating member 54, and the control board 46.

The bottom wall 72 of the case 16 is provided with the opening hole 14 that passes through vertically in a central part. In other words, on the case 16, the bottom wall 72 is the peripheral edge portion of the opening hole 14. The opening hole 14 is substantially rectangular in shape when looking from above, and has a size that is substantially equal to or slightly larger than the lower surface of the semiconductor module 12 and the thermally conductive sheet 70. The peripheral wall 74 that protrudes upward is provided on the bottom wall 72 on the outer periphery of the opening hole 14. Note that as depicted in the enlarged view in FIG. 4, an annular positioning protrusion 75 that protrudes inward is provided in a stepped shape on the bottom wall 72 at the inner peripheral edge of the opening hole 14.

In this first embodiment, the peripheral wall 74 has a triple-wall structure with walls that are separated in the radial direction. The peripheral wall 74 is composed of the inner peripheral wall portion 76 that is innermost, an outer peripheral wall portion 78 that is outermost, and an intermediate wall portion 80 located at an intermediate part in the radial direction between the inner peripheral wall portion 76 and the outer peripheral wall portion 78. That is, the inner peripheral wall portion 76 is provided on the outside of the opening hole 14, the outer peripheral wall portion 78 is provided on the outer peripheral edge of the bottom wall 72, and the intermediate wall portion 80 is provided on a radially intermediate part of the bottom wall 72. By doing so, it is possible to advantageously prevent water from infiltrating the case 16. At the four corners of the inner peripheral wall portion 76, bolt insertion holes 82 that pass through vertically are formed at positions corresponding to the bolt insertion holes 64 of the insulating member 54. Bolt holes 84 into which bolts 94, which will be described later, are fastened are formed in the four corners of the intermediate wall portion 80 at positions corresponding to the bolt insertion holes 50 of the control board 46.

Heat Dissipating Plate 20

A heat dissipating plate 20 of a size capable of covering the opening hole 14 of the case 16 is provided so as to be placed over the lower surface of the case 16. The heat dissipating plate 20 is formed of a material with higher thermal conductivity than the case 16. This material is selected with consideration to strength, weight, cost, and the like, but as one example is preferably made of metal. In this first embodiment, the heat dissipating plate 20 is formed of aluminum (which includes aluminum alloy). In the first embodiment, the heat dissipating plate 20 is in the shape of a substantially rectangular plate and has bolt insertion holes 86 that pass through vertically and are formed at positions corresponding to the bolt insertion holes 64 and 82. In addition, cap nuts 88 are attached to positions corresponding to the bolt insertion holes 86 on the lower surface of the heat dissipating plate 20.

On the upper surface, which is the inner surface when the heat dissipating plate 20 has been attached, a housing groove 90 for housing the sealing member 22 is formed to the outside of the bolt insertion holes 86. The housing groove 90 is a substantially annular rectangular groove, is continuous around the entire circumference, and is provided on the outside of the opening hole 14 when the heat dissipating plate 20 is fixed to the case 16.

Sealing Member 22

The sealing member 22 is in substantially the same shape as the housing groove 90 and therefore shaped as a substantially annular rectangle. The sealing member 22 is formed of an elastic material, such as rubber, and is an O-ring whose cross section is circular as a standalone product before attachment between the case 16 and the heat dissipating plate 20. The outer diameter dimension of the circular cross section of the sealing member 22 is larger than the depth dimension (that is the vertical dimension) of the housing groove 90 in the heat dissipating plate 20. With this configuration, by placing the sealing member 22 between the case 16 and the heat dissipating plate 20, the sealing member 22 becomes compressed between the case 16 and the heat dissipating plate 20 and forms a liquid-tight seal between the case 16 and the heat dissipating plate 20 in the form of a planar seal.

Assembly Process of Circuit Assembly 10

Next, a specific example of an assembly process of the circuit assembly 10 will be described. Note that the assembly process of the circuit assembly 10 is not limited to the following description.

First, a semiconductor module 12 that has the thermally conductive sheet 70 attached to a lower surface thereof is prepared, and the bus bars 34 and the crimped terminals 42 provided at the ends of the electric wires 40 are placed over the main circuit terminals 24 of the semiconductor module 12. The bolt holes 26, the bolt insertion holes 36, and the bolt holes 44 are placed in alignment, and the bolts 38 are inserted through the holes and fastened to the nuts 28. By doing so, the main circuit terminals 24 of the semiconductor module 12, the bus bars 34, and the electric wires 40 are electrically connected.

After this, in a state where the semiconductor module 12 to which the bus bars 34 and the electric wires 40 have been fixed has been positioned inside the inner peripheral wall portion 76 of the case 16, the heat dissipating plate 20 that has the sealing member 22 housed in the housing groove 90 is brought in close from below so as to cover the opening hole 14 of the case 16. Note that the stepped positioning protrusion 75 and the positioning recess 33 that correspond to each other are provided at the inner peripheral edge of the opening hole 14 of the case 16 and the outer peripheral edge of the lower surface of the semiconductor module 12, so that when the semiconductor module 12 is attached to the case 16, the semiconductor module 12 and the case 16 become horizontally positioned relative to each other.

The insulating member 54 is brought in close to cover the semiconductor module 12 from above and the electric wires 40 are inserted through the electric wire insertion holes 68 of the insulating member 54 so that the electric wires 40 protrude above the insulating member 54. In a state where the bolt insertion holes 64, 82, and 86 have been placed in alignment, the bolts 92 are inserted and fastened to the cap nuts 88 provided on the lower surface of the heat dissipating plate 20.

By doing so, the insulating member 54, the semiconductor module 12, the case 16, and the heat dissipating plate 20 are fixed in the vertical direction. That is, the semiconductor module 12 is sandwiched between the insulating member 54 and the heat dissipating plate 20 which are linked and fixed together by the bolts 92. By doing so, the semiconductor module 12 is placed in thermal contact with the inner surface (upper surface) of the heat dissipating plate 20. In this first embodiment, the downward protrusions 62 of the insulating member 54 and the upward protrusion 32 of the semiconductor module 12 contact each other or are separated but face each other at a slight distance. This means that when the insulating member 54 is attached to the case 16, displacement of the semiconductor module 12 in the vertical direction between the case 16 and the insulating member 54 is suppressed. As a result, separation of the semiconductor module 12 from the heat dissipating plate 20 and/or the housing 18 can be prevented by the insulating member 54, and contact between the lower surface of the semiconductor module 12 (that is, the thermally conductive sheet 70) and the heat dissipating plate 20 can be stably maintained. Accordingly, by placing the downward protrusions 62 and the upward protrusion 32 in contact with each other, the fixing force of the bolts 38 will act on the semiconductor module 12 via the downward protrusions 62 and the upward protrusion 32, so that it is also possible to press the lower surface of the semiconductor module 12 against the heat dissipating plate 20 via the thermally conductive sheet 70. In short, by attaching the insulating member 54 on the case 16, the heat generating component (that is, the semiconductor module 12) can be pressed toward the heat dissipating plate 20 by the insulating member 54.

In a state where the sealing member 22 has been placed in the housing groove 90, the case 16 and the heat dissipating plate 20 are fixed by tightening the bolts 92, resulting in the open side of the housing groove 90 being covered by the bottom wall 72 of the case 16. By doing so, the sealing member 22 becomes interposed in a compressed state between the bottom surface of the case 16, that is, the lower surface of the bottom wall 72, and the heat dissipating plate 20. Accordingly, in this first embodiment, the attached member to be attached to the case 16 is composed of the heat dissipating plate 20, and the sealing member 22 is interposed between the case 16 and this attached member (that is, the heat dissipating plate 20) on the outside of the opening hole 14, which forms a liquid-tight seal between the case 16 and the heat dissipating plate 20.

Next, the control board 46 is moved close to the insulating member 54 from above, the electric wires 40 are inserted through the through holes 52 in the control board 46, and the control circuit (not illustrated) on the control board 46 and the electric wires 40 are electrically connected. The bolt insertion holes 50 in the control board 46 and the bolt holes 84 in the case 16 are placed in alignment, and the bolts 94 are inserted and fastened. By doing so, the circuit assembly 10 according to the first embodiment is completed.

The circuit assembly 10 is fixed to the housing 18 so that the outer surface (lower surface) of the heat dissipating plate 20 provided on the bottom is placed over and in thermal contact with the housing 18, which is made of metal. Note that recesses may be provided at positions on the housing 18 that correspond to the cap nuts 88, and by accommodating the cap nuts 88 in these recesses, it is possible to avoid interference between the cap nuts 88 and the housing 18.

In the circuit assembly 10 according to the first embodiment, the semiconductor module 12 is exposed to the outside from the opening hole 14 of the case 16, and the part of the semiconductor module 12 that is exposed to the outside is in contact with the heat dissipating plate 20 that has higher thermal conductivity than the case 16. Via this heat dissipating plate 20, the semiconductor module 12 is in thermal contact with the housing 18, which is an external heat dissipator for the heat of the semiconductor module 12. As a result, the heat of the semiconductor module 12 generated due to current conduction is dissipated from the housing 18 via the thermally conductive sheet 70 and the heat dissipating plate 20.

This means that on the heat dissipation path from the semiconductor module 12 to the housing 18, the heat dissipating plate 20 that has higher thermal conductivity than the case 16 is provided in place of the case 16 that is made of synthetic resin, which improves the efficiency of heat dissipation. Also, by interposing the sealing member 22 between the case 16 and the heat dissipating plate 20, which is the attached member, on the outside of the opening hole 14, a liquid-tight seal is maintained in the form of a planar seal between the case 16 and the heat dissipating plate 20, which prevents water from infiltrating the circuit assembly 10 through the opening hole 14.

The housing groove 90 for housing the sealing member 22 is provided in the upper surface of the case 16, and the case 16 and the heat dissipating plate 20 are attached in a state where the sealing member 22 has been placed in the housing groove 90. By doing so, displacement of the sealing member 22 is prevented when the case 16 and the heat dissipating plate 20 are assembled, and a liquid-tight seal can be more stably formed between the case 16 and the heat dissipating plate 20 around the outside of the opening hole 14.

The semiconductor module 12 is provided with the upward protrusion 32 that protrudes upward and the insulating member 54 is provided with the downward protrusions 62 that protrude downward. When the circuit assembly 10 is assembled, the upward protrusion 32 and the downward protrusions 62 can suppress vertical displacement of the semiconductor module 12 between the insulating member 54 and the case 16. In addition, by attaching the insulating member 54 on the case 16, the semiconductor module 12 can also be pressed against the heat dissipating plate 20 by the insulating member 54, which places the semiconductor module 12 more stably in thermal contact with the heat dissipating plate 20 and can further improve the efficiency of heat dissipation.

Second Embodiment

Figure 6:
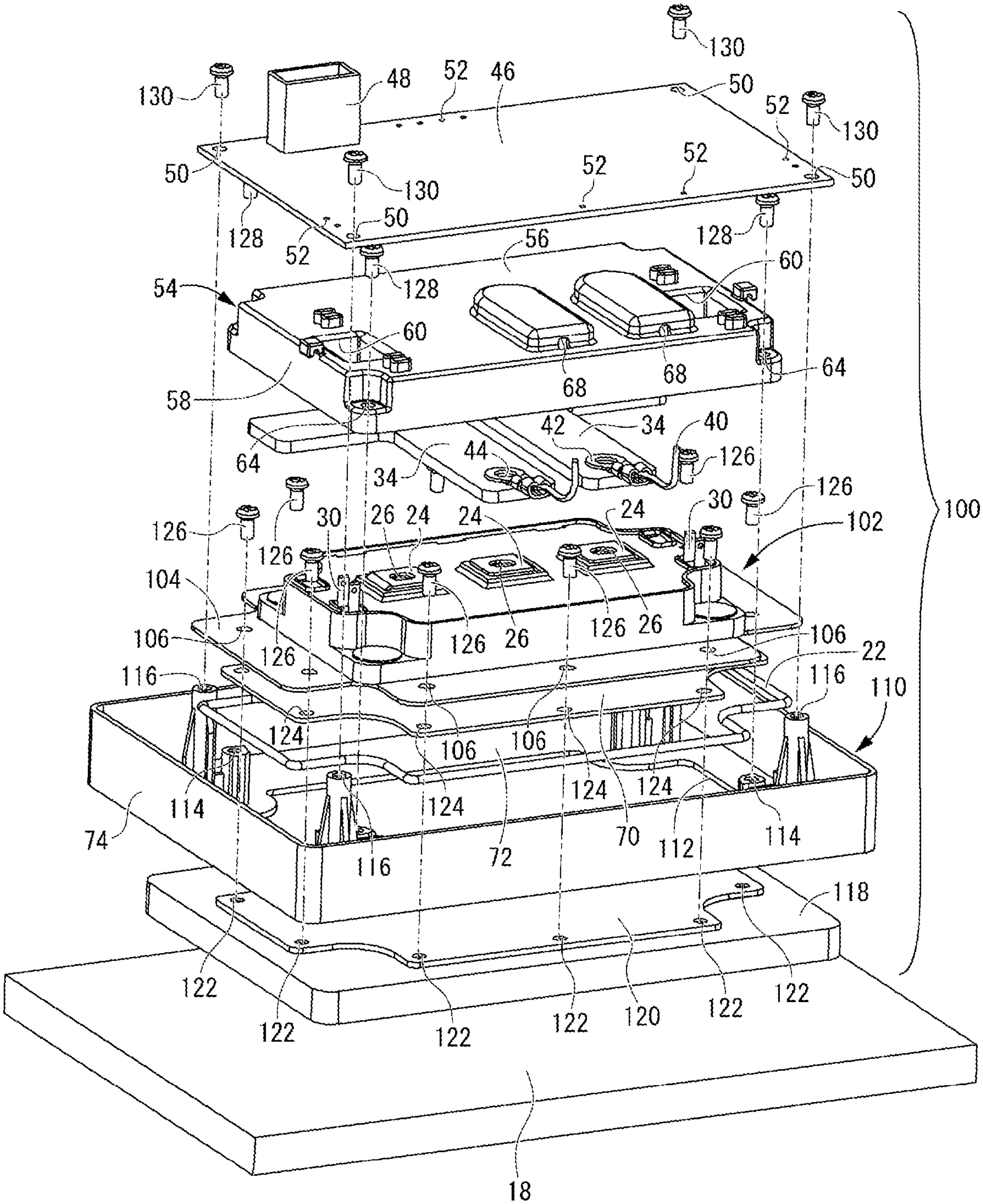
FIG. 6 is an exploded perspective view of a circuit assembly according to a second embodiment.
Figure 7:
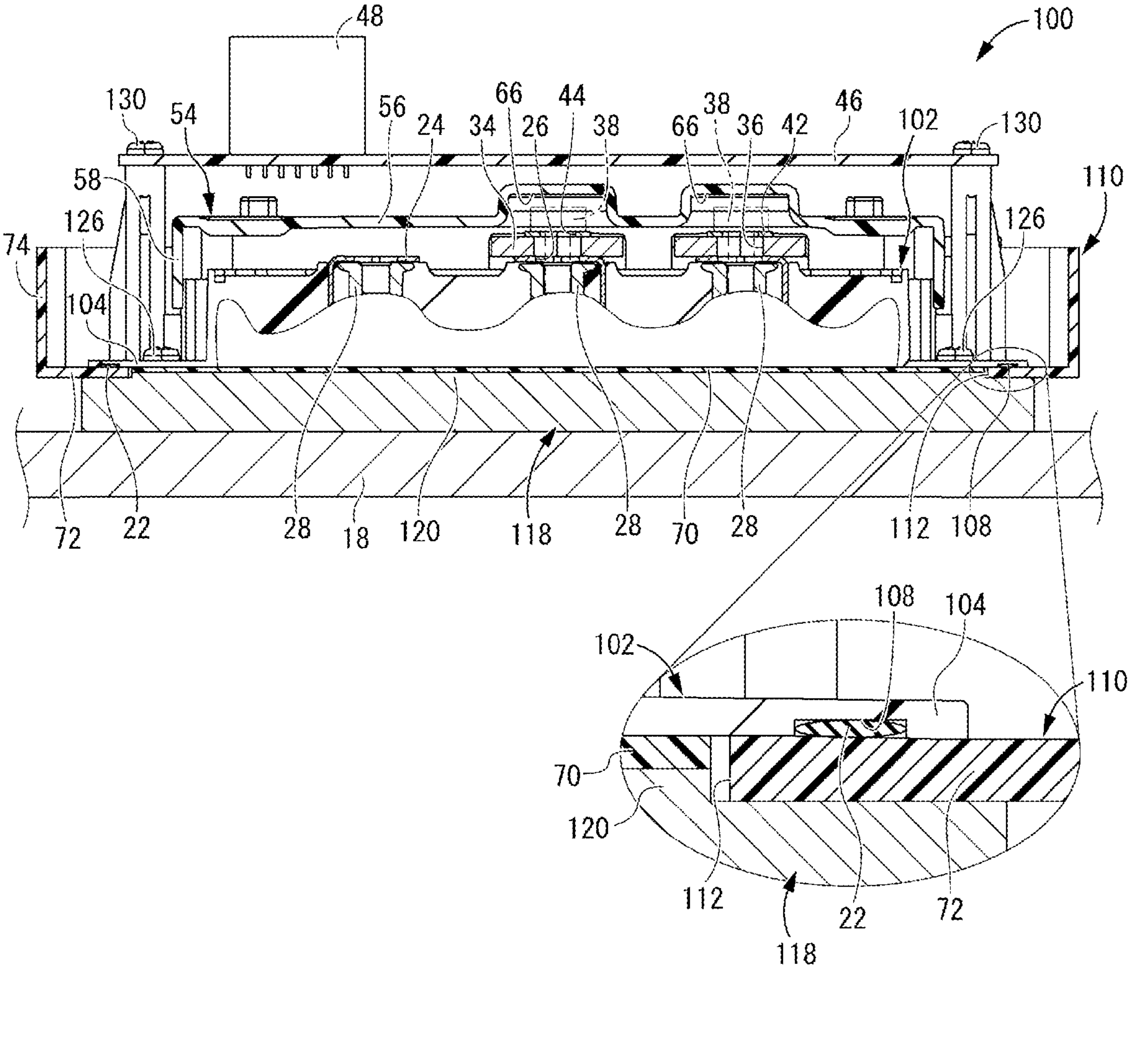
FIG. 7 is a vertical cross-sectional view of the circuit assembly depicted in FIG. 6 and corresponds to FIG. 4.

A circuit assembly 100 according to a second embodiment of the present disclosure is described below with reference to FIGS. 6 and 7. The overall configuration of the circuit assembly 100 according to the second embodiment is the same as the circuit assembly 10 according to the first embodiment. In the following description, parts that differ from the circuit assembly 10 according to the first embodiment are described and members and parts that are substantially the same as the circuit assembly 10 according to the first embodiment have been assigned the same reference numerals as in the circuit assembly 10 according to the first embodiment in the drawings and detailed description thereof is omitted.

A semiconductor module 102 as a heat generating component in this second embodiment includes a flange 104 that protrudes outward in a substantially annular shape at the outer peripheral edge of the semiconductor module 102. In more detail, the flange 104 protrudes from the lower end of the semiconductor module 102 on both sides in the front-rear direction and on both sides in the left-right direction. The flange 104 is integrally formed with the resin material that constructs the semiconductor module 102 (or the hollow case of the semiconductor module) and is electrically insulating. Bolt holes 106 are formed at a plurality of locations on the flange 104 around its circumference. As depicted in FIG. 7, a housing groove 108 for accommodating the annular sealing member 22 is formed in the lower surface of the flange 104. The housing groove 108 is provided on the lower surface of the flange 104 on both sides in the front-rear direction and on both sides in the left-right direction, and is also provided at the four corners of the lower surface of the semiconductor module 102 so as to connect the four sides and thereby form an annular shape that is continuous around the entire circumference. It should be noted that the bolt holes 106 in the flange 104 become positioned inside an opening hole 112 when the semiconductor module 102 is attached to a case 110, and the housing groove 108 in the flange 104 becomes positioned outside the opening hole 112.

When looking from above, the opening hole 112 in the case 110 according to the second embodiment has substantially the same shape as the semiconductor module 102 that includes the flange 104, but the size of the opening hole 112 is smaller than the semiconductor module 102 including the flange 104. This means that as described later, when the semiconductor module 102 is mounted inside the case 110, the flange 104 of the semiconductor module 102 is placed in contact with the bottom wall 72 that is the peripheral edge portion of the opening hole 112 in the case 110. In addition, on the outside of the opening hole 112 in the bottom wall 72 of the case 110, inner periphery bolt holes 114 that extend upward are provided at the four corners around the circumference, with outer periphery bolt holes 116 that extend upward also being provided to the outside of these inner periphery bolt holes 114.

A contact protrusion 120 that protrudes upward and contacts the semiconductor module 102 is provided on the upper surface of a heat dissipating plate 118 according to the second embodiment. The contact protrusion 120 has substantially the same shape as the opening hole 112 of the case 110 when looking from above, and the size of the contact protrusion 120 is substantially the same as or slightly smaller than the opening hole 112. This means that as described later, when the heat dissipating plate 118 is attached to the case 110, the contact protrusion 120 of the heat dissipating plate 118 fits inside the opening hole 112 of the case 110. In the contact protrusion 120, a plurality of bolt holes 122 in which nuts (not illustrated) are embedded are formed at positions corresponding to the bolt holes 106 of the flange 104. In addition, a thermally conductive sheet 70 according to the second embodiment has substantially the same shape as the contact protrusion 120 when looking from above and has bolt holes 124 formed so as to pass through in the thickness direction (that is, the vertical direction) at positions corresponding to the bolt holes 122 in the contact protrusion 120.

Assembly Process of Circuit Assembly 100

First, the sealing member 22 is housed in the housing groove 108 of the semiconductor module 102 that has the thermally conductive sheet 70 attached to its lower surface, and this is placed on the bottom wall 72 of the case 110. Alternatively, the sealing member 22 is disposed on the bottom wall 72 of the case 110, which is the peripheral edge portion of the opening hole 112, and the semiconductor module 102 is placed on this from above. Note that the flange 104 of the semiconductor module 102 protrudes on both sides in the front-rear and the left-right directions, or in other words, has a shape in which the four corners of the periphery are cut out. On the other hand, the bottom wall 72 of the case 110 is formed with the inner periphery bolt holes 114 and the outer periphery bolt holes 116 that extend upward at the four corners around the circumference. With this configuration, the inner and outer periphery bolt holes 114 and 116 and the flange 104 achieve a positioning effect of positioning the semiconductor module 102 in the horizontal direction with respect to the case 110.

The heat dissipating plate 118 is then brought close to the case 110 from below and the bolt holes 106, the bolt holes 124, and the bolt holes 122 are placed in alignment. After this, the bolts 126 are inserted from above through the bolt holes 106, 124, and 122 and fastened to nuts (not illustrated) provided on the heat dissipating plate 118. As a result, the semiconductor module 102 and the heat dissipating plate 118 are bolted onto an inner periphery of the opening 112 in the case 110, and the semiconductor module 102 is brought into thermal contact with the heat dissipating plate 118 via the thermally conductive sheet 70. In other words, as depicted in the enlarged view in FIG. 7, by bolting the flange 104 and the heat dissipating plate 118 to the inner periphery of the opening hole 112, an inner peripheral edge of the bottom wall 72 of the case 110 becomes interposed between the flange 104 and the heat dissipating plate 118 at the outer periphery of the opening hole 112.

At the outer periphery of the opening hole 112 in the case 110, the sealing member 22 is interposed in a compressed state between the flange 104 and the bottom wall 72 of the case 110, which is a peripheral edge portion of the opening hole 112, resulting in a liquid-tight seal being formed between the flange 104 (that is, the semiconductor module 102) and the case 110 in the form of a planar seal achieved by the sealing member 22. That is, in this second embodiment, the attached member that is attached to the case 110 and acts together with the case 110 to sandwich the sealing member 22 is composed of the semiconductor module 102. In more detail, parts of the sealing member 22 is sandwiched between the flange 104 and the bottom wall 72 of the case 110 on both sides in the front-rear direction and both sides in the left-right direction of the peripheral edge portion of the opening hole 112, with other parts of the sealing member 22 being sandwiched between the four corners of the semiconductor module 102 and the bottom wall 72 of the case 110.

After this, the bus bars 34 and the crimped terminals 42 provided at the ends of the electric wires 40 are placed over the main circuit terminals 24 of the semiconductor module 102, and these components are fastened with the bolts 38. The insulating member 54 is then brought close to the semiconductor module 102 from above, and the bolt insertion holes 64 provided at the four corners of the insulating member 54 and the inner periphery bolt holes 114 provided at the four corners of the case 110 are placed in alignment. The bolts 128 are inserted through the bolt insertion holes 64 and the inner periphery bolt holes 114 and fastened. Finally, the control board 46 is brought close to the insulating member 54 from above, and the bolt insertion holes 50 provided at the four corners of the control board 46 and the outer periphery bolt holes 116 provided at the four corners of the case 110 are placed in alignment. The bolts 130 are inserted through the bolt insertion holes 50 and the outer periphery bolt holes 116 and fastened. By doing so, the circuit assembly 100 according to the second embodiment is completed.

With the circuit assembly 100 according to the second embodiment, like the circuit assembly 10 according to the first embodiment, since the heat dissipating plate 118 that has higher thermal conductivity is provided on the heat dissipation path in place of the case 110 which is made of synthetic resin, the efficiency of heat dissipation is improved. In addition, the sealing member 22 is compressed between the flange 104 and the bottom wall 72 of the case 110 at the peripheral edge portion of the opening hole 112, which forms a liquid-tight seal between the flange 104 (that is, the semiconductor module 102) and the case 110 in the form of a planar seal. This prevents water from infiltrating from the outside to the inside through the opening hole 112. Note that although the sealing member 22 prevents infiltration of water from the opening 112 between the flange 104 and the bottom wall 72 of the case 110, infiltration of water that reaches the lower surface of the semiconductor module 102 from the opening hole 112 can be prevented by the thermally conductive sheet 70. With this configuration, even if the substrate of the semiconductor module 102 is made of metal, it is possible to prevent electrical short circuits from occurring due to water that has infiltrated.

In particular, in this second embodiment, since the sealing member 22 is interposed between the widened flange 104 and the peripheral edge portion of the opening hole 112, a planar sealing effect is achieved, resulting in more stable waterproofing. The shape of the flange 104 can be set in keeping with the shape of the opening hole 112, and the structures for attaching the insulating member 54, the control board 46, and the like can be designed with a high degree of freedom while maintaining the waterproofing.

Third Embodiment

Figure 8:
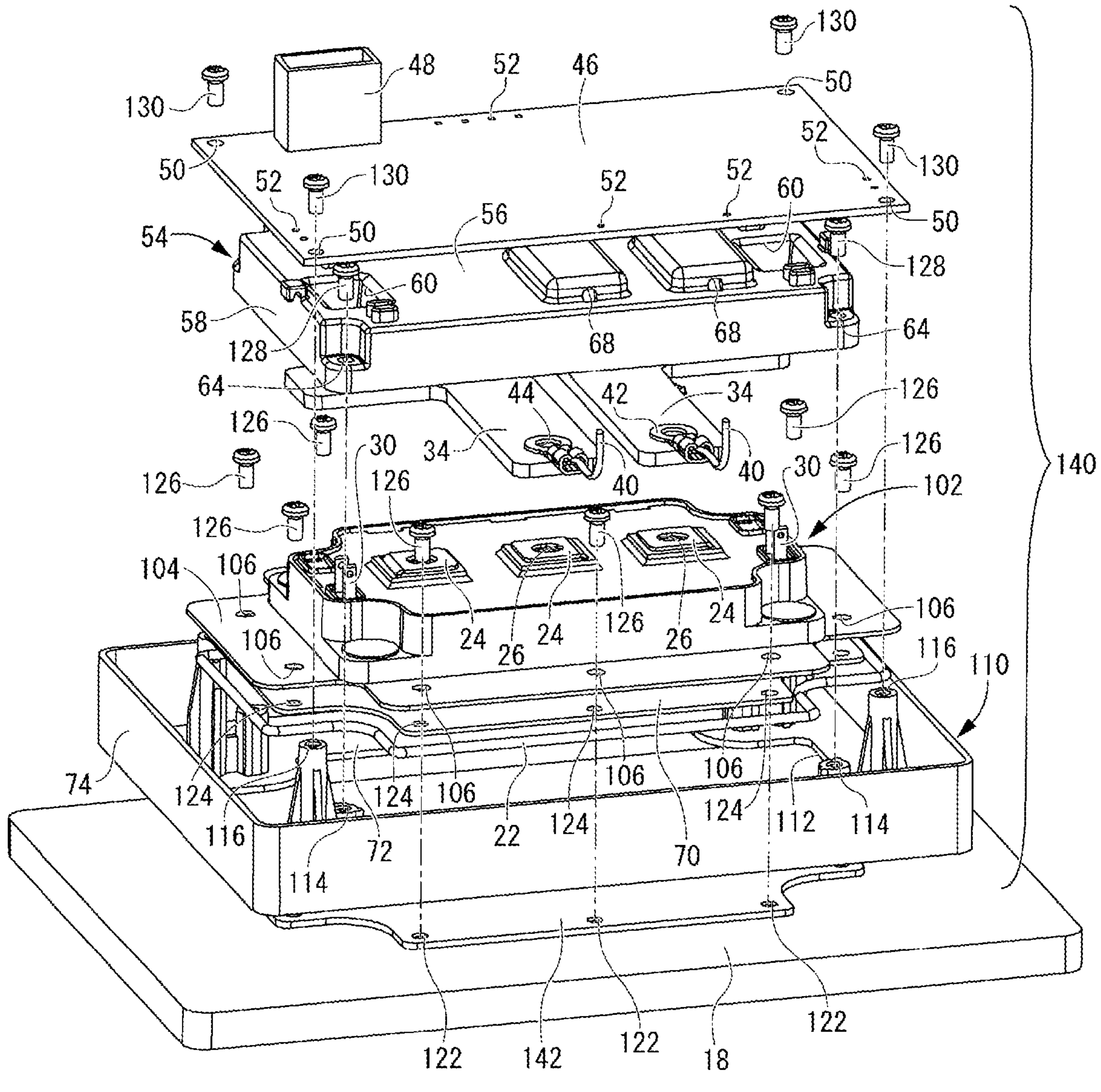
FIG. 8 is an exploded perspective view of a circuit assembly according to a third embodiment.
Figure 9:
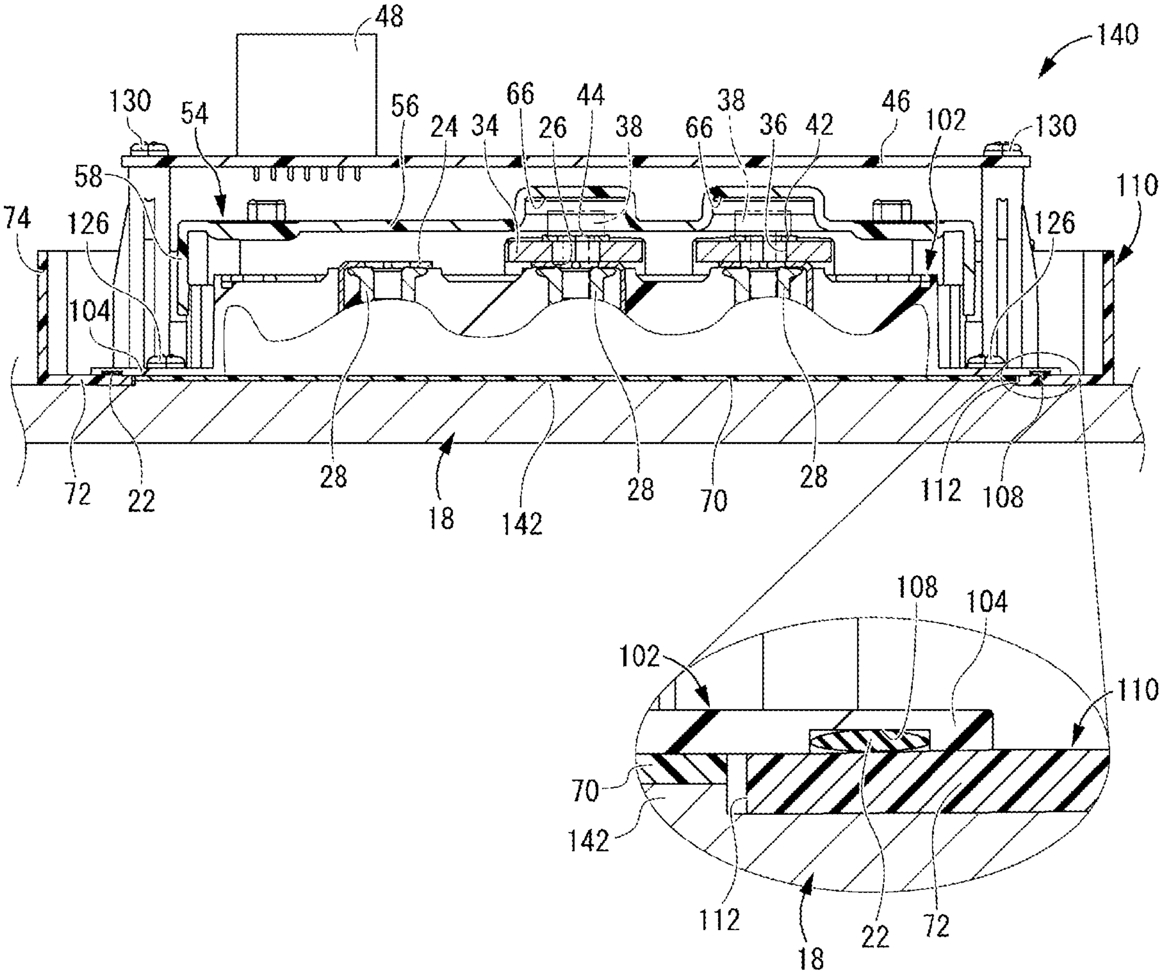
FIG. 9 is a vertical cross-sectional view of the circuit assembly depicted in FIG. 8 and corresponds to FIG. 4.

A circuit assembly 140 according to a third embodiment of the present disclosure is described below with reference to FIGS. 8 and 9. The circuit assembly 140 according to the third embodiment has a configuration where a heat dissipating plate is not provided in the circuit assembly 100 according to the second embodiment. Accordingly, in the third embodiment, the housing 18 is provided with a contact protrusion 142 that protrudes upward and thermally contacts the semiconductor module 102 through the opening hole 112 when assembled in the circuit assembly 140. The contact protrusion 142 has substantially the same shape as the contact protrusion 120 of the circuit structure 100 according to the second embodiment, and has a size that is substantially the same or slightly smaller than the opening hole 112. A plurality of bolt holes 122 in which nuts (not illustrated) are embedded are formed in the contact protrusion 142 at positions corresponding to the bolt holes 106 of the flange 104.

Assembly Process of Circuit Assembly 140

Although the semiconductor module 102 and the heat dissipating plate 118 are fastened with the bolts 126 in the second embodiment, in the circuit assembly 140 according to the third embodiment, the semiconductor module 102 and the housing 18 are fastened with the bolts 126. That is, after placing the case 110 on the housing 18, the semiconductor module 102 is placed inside the case 110. The bolt holes 106, the bolt holes 124, and the bolt holes 122 are placed in alignment, and the bolts 126 are inserted and fastened. By doing so, the semiconductor module 102, the case 110, and the housing 18 are fixed with the bolts 126. After this, the bus bars 34 and the electric wires 40 with the crimped terminals 42 are attached onto the main circuit terminals 24 of the semiconductor module 102, and by further attaching the insulating member 54 and the control board 46 from above, the circuit assembly 140 according to the third embodiment is completed.

In the circuit assembly 140 according to the third embodiment, the sealing member 22 is compressed between the flange 104 of the semiconductor module 102 and the bottom wall 72 of the case 110 at the peripheral edge portion of the opening hole 112, which prevents infiltration of water from the outside to the inside through the opening hole 112. In this circuit assembly 140, it is possible to omit the heat dissipating plates 20 and 118 used in the first and second embodiments. Since the semiconductor module 102 is in thermal contact with the housing 18 via only the thermally conductive sheet 70, it is possible to further reduce the number of members located on the heat dissipation path, which further improves the efficiency of heat dissipation.

Fourth Embodiment

Figure 10:
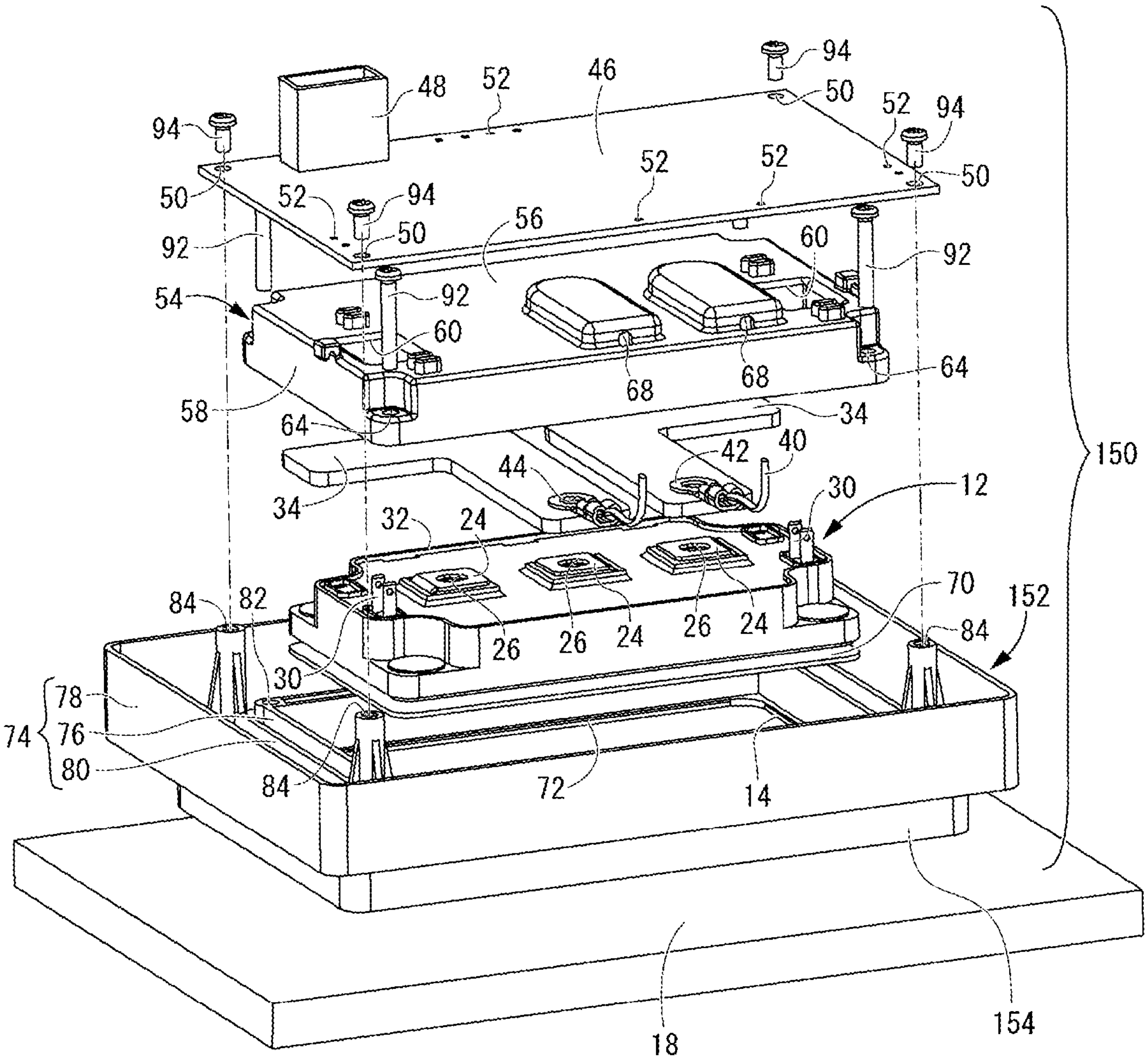
FIG. 10 is an exploded perspective view of a circuit assembly according to a fourth embodiment.
Figure 11:
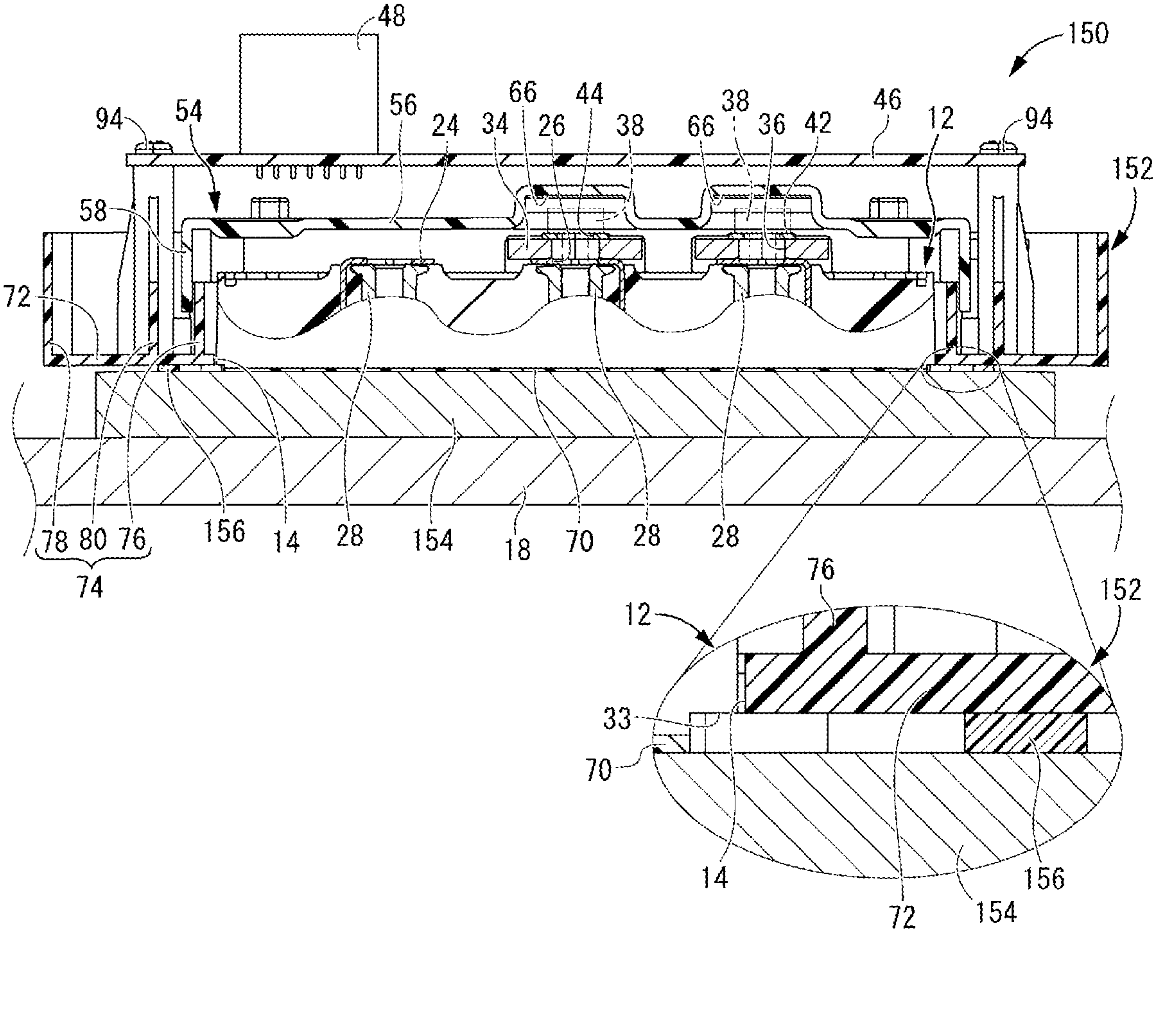
FIG. 11 is a vertical cross-sectional view of the circuit assembly depicted in FIG. 10 and corresponds to FIG. 4.

A circuit assembly 150 according to a fourth embodiment of the present disclosure is described below with reference to FIGS. 10 and 11. The circuit assembly 150 according to the fourth embodiment has the same configuration as the circuit assembly 10 according to the first embodiment, but a case 152 and a heat dissipating plate 154 are integrally formed. Note that the case 152 and the heat dissipating plate 154 according to the fourth embodiment have the same shapes as the case 16 and the heat dissipating plate 20 according to the first embodiment. That is, although not clear from the drawings, in the same way as the heat dissipating plate 20 according to the first embodiment, the heat dissipating plate 154 according to the fourth embodiment is provided with bolt insertion holes 86 through which the bolts 92 are inserted at the four corners around the circumference. In this fourth embodiment, nuts are embedded inside the bolt insertion holes 86.

In the circuit assembly 150 according to the fourth embodiment, a dissimilar bonding material 156 for bonding dissimilar materials is provided as a sealing member between the case 152, which is made of synthetic resin, and the heat dissipating plate 154, which is made of metal. Although it is possible to use a conventionally known adhesive capable of bonding together a synthetic resin member and a metal member as one example of the dissimilar bonding material 156, it is preferable for the dissimilar bonding material 156 to exhibit elasticity, like rubber or an elastomer. In this fourth embodiment, a thermoplastic polyester elastomer called "Hytrel (registered trademark)" manufactured by DuPont Toray Co., Ltd. is used.

Assembly Process of Circuit Assembly 150

First, the heat dissipating plate 154 is prepared, and uncured dissimilar bonding material 156 (Hytrel (registered trademark)) is applied in a ring to an outer circumferential part of the heat dissipating plate 154 (the part where the housing groove 90 is formed and the sealing member 22 is housed in the first embodiment). After this, the dissimilar bonding material 156 is cured. The case 152 is molded by filling a molding cavity for the case 152 with the resin material of the case 152 in a state where the heat dissipating plate 154 to which the dissimilar bonding material 156 has been attached has been set in the molding cavity. By doing so, the case 152 is attached to the dissimilar bonding material 156 to obtain the case 152 that is integrally provided with the heat dissipating plate 154. Note that in a product where the case 152 and the heat dissipating plate 154 are integrally molded, the annular dissimilar bonding material 156 is interposed between the bottom wall 72 of the case 152, which is the peripheral edge portion of the opening hole 14, and an upper surface which is a surface of the heat dissipating plate 154 that contacts the case 152. That is, in this fourth embodiment, the attached member that is attached to the case 152 and sandwiches the dissimilar bonding material 156, which is the sealing member, in concert with the case 152 is composed of the heat dissipating plate 154.

After this, the semiconductor module 12 that has the thermally conductive sheet 70 attached to its lower surface is prepared and is mounted on the product produced by integrally molding the case 152 and the heat dissipating plate 154. Next, the bus bars 34 and the crimped terminals 42 are placed on the main circuit terminals 24 of the semiconductor module 12 and are fixed by fastening the bolts 38. The insulating member 54 is then brought close to the semiconductor module 12 from above and the bolts 92 are inserted through the bolt insertion holes 64, 82, and 86 and fastened. In addition, the control board 46 is brought close to the insulating member 54 from above and the bolts 94 are inserted through the bolt insertion holes 50 and the bolt holes 84 and fastened. This completes the circuit assembly 150 according to the fourth embodiment.

The circuit assembly 150 according to the fourth embodiment is attached to the housing 18 so that the lower surface of the heat dissipating plate 154 is placed on the housing 18. By doing so, the heat generated in the semiconductor module 12 is dissipated from the housing 18 via the heat dissipating plate 154. At the peripheral edge portion of the opening hole 14, a liquid-tight seal is formed between the bottom wall 72 of the case 152 and the heat dissipating plate 154 by the dissimilar bonding material 156 that is the sealing member, which prevents water from infiltrating the inside from the outside via the opening hole 14.

In the circuit assembly 150 according to the fourth embodiment, since the case 152 and the heat dissipating plate 154 are integrally formed, it is possible to reduce the number of parts when assembling the circuit assembly 150, which improves the efficiency of assembly. Since the dissimilar bonding material 156 is provided between the case 152 and the heat dissipating plate 154, a synthetic resin member and a metal member, which are difficult to attach, can be attached together more reliably and this attached state can be stably maintained. In particular, although gaps are likely to occur between the case and the heat dissipating plate due to sink marks produced during molding of the case and the difference in the coefficients of linear expansion between the case and the heat dissipating plate, the dissimilar bonding material 156 exhibiting elasticity means that the occurrence of gaps between the case 152 and the heat dissipating plate 154 is prevented by elastic deformation of the dissimilar bonding material 156.

Fifth Embodiment

Figure 12:
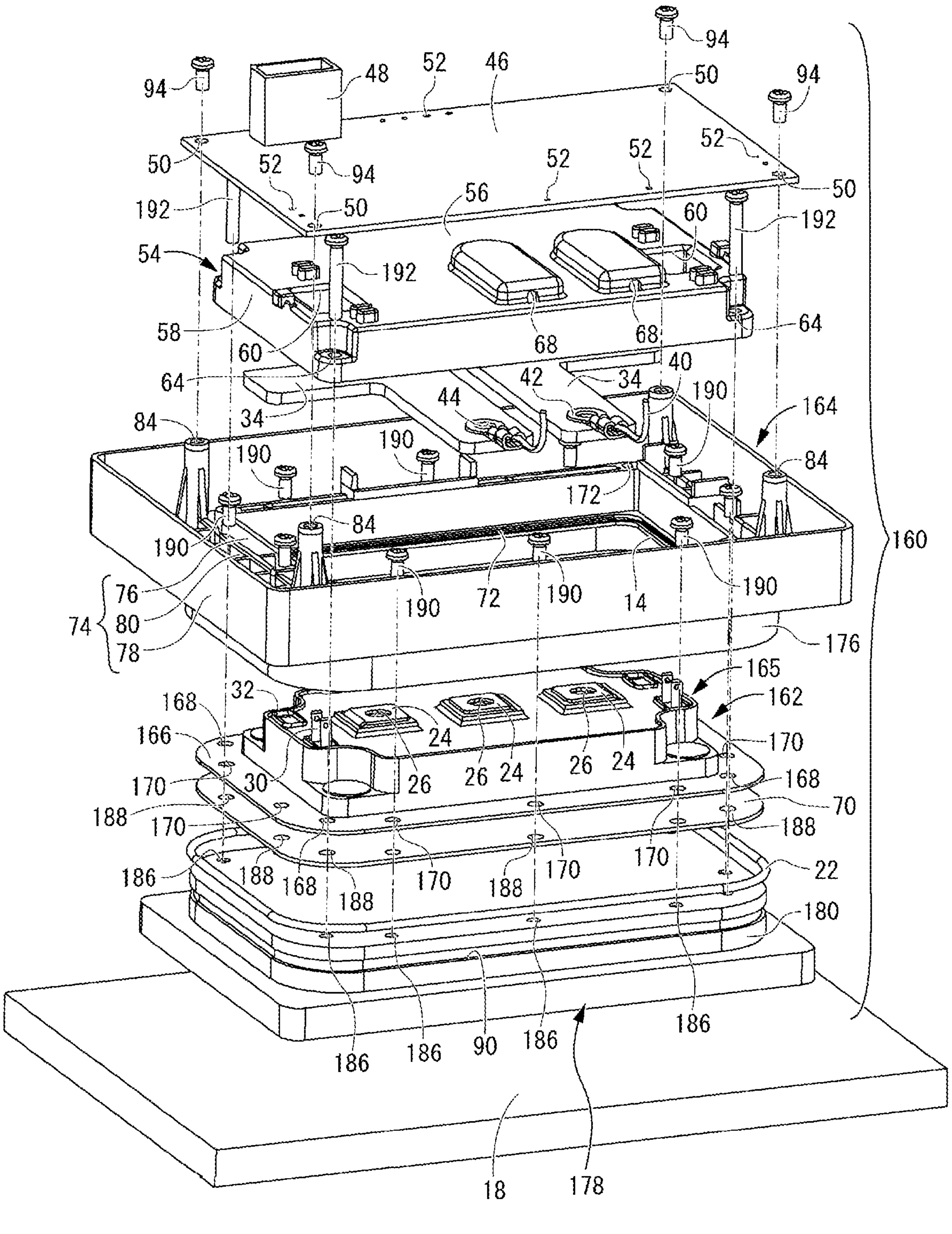
FIG. 12 is an exploded perspective view of a circuit assembly according to a fifth embodiment.
Figure 13:
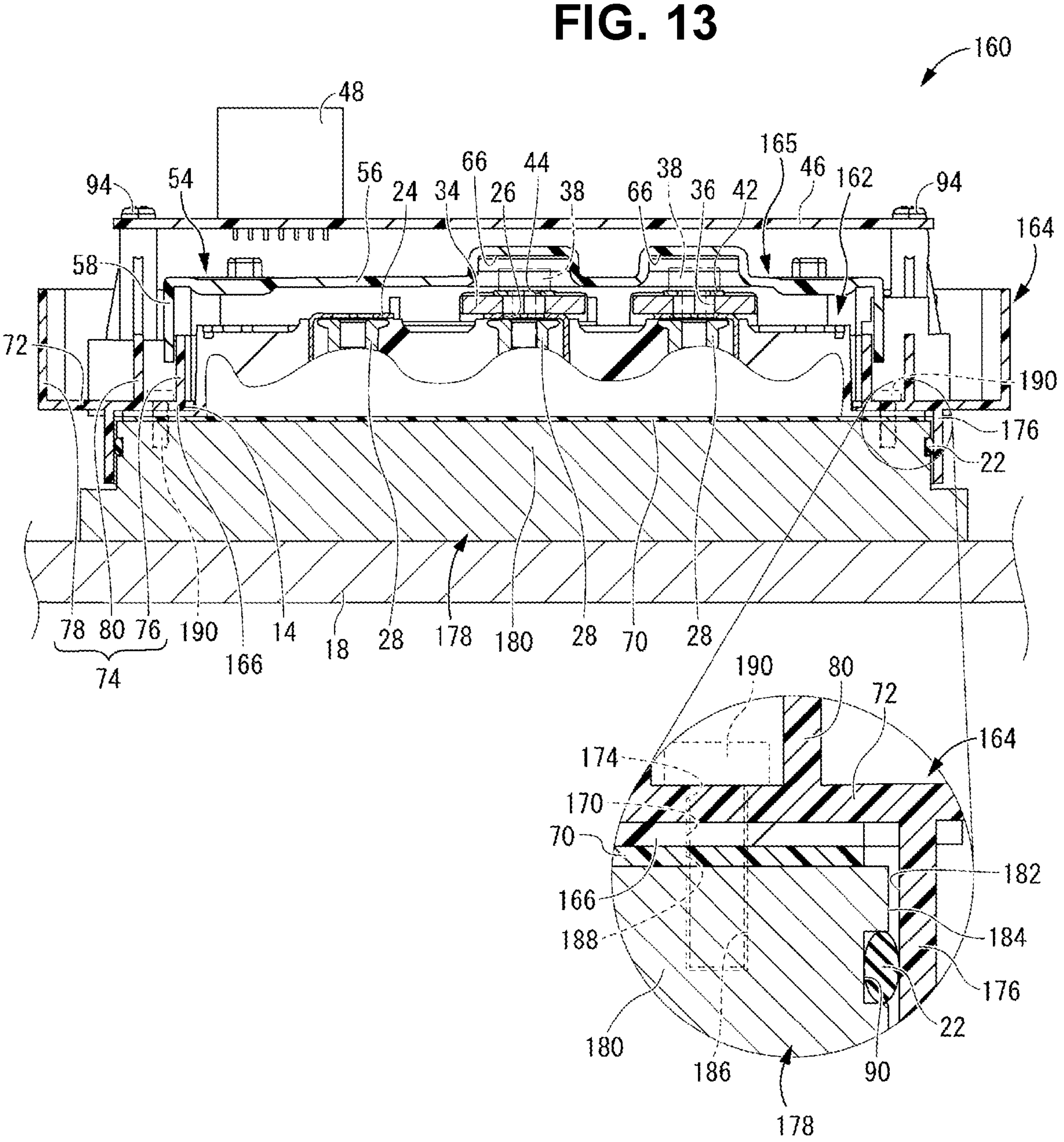
FIG. 13 is a vertical cross-sectional view of the circuit assembly depicted in FIG. 12 and corresponds to FIG. 4.

A circuit assembly 160 according to a fifth embodiment of the present disclosure is described below with reference to FIGS. 12 and 13. As one example, although in the circuit assembly 10 according to the first embodiment, the semiconductor module 12 is attached to the case 16 from above, like the circuit assembly 160 according to the fifth embodiment, a semiconductor module 162 as a heat generating component may be attached to a case 164 from below. The semiconductor module 162 according to the fifth embodiment is provided with an annular flange 166 that protrudes outward around substantially the entire circumference at the lower end of the outer peripheral edge of a main body part 165. Four first bolt holes 168 are provided at the four corners of the annular flange 166, and a plurality of second bolt holes 170 are provided between the first bolt holes 168 in the front-rear direction or in the left-right direction.

In the same way as the first embodiment, the peripheral wall 74 of the case 164 according to the fifth embodiment has a triple wall structure composed of walls that are separated in the radial direction, and includes the inner peripheral wall portion 76, the outer peripheral wall portion 78, and the intermediate wall portion 80. First bolt insertion holes 172 are provided at the four corners of the inner peripheral wall portions 76, and bolt holes 84 are provided at the four corners of the intermediate wall portions 80. Also, as depicted in the enlarged view in FIG. 13, at positions of the bottom wall 72 of the case 164 that are radially between the inner peripheral wall portion 76 and the intermediate wall portion 80, second bolt insertion holes 174 that pass through in the vertical direction are provided at positions that correspond to the second bolt holes 170 of the annular flange 166.

The bottom wall 72 of the case 164 is integrally formed with a cylindrical wall portion 176 that is substantially cylindrical and protrudes downward. The cylindrical wall portion 176 is formed with a size that is larger than the annular flange 166 when looking from above, and in this fifth embodiment is provided at a radially intermediate part between the intermediate wall portion 80 and the outer peripheral wall portion 78.

The heat dissipating plate 178 according to the fifth embodiment has a protruding portion 180 that protrudes toward the semiconductor module 162 (that is, upward). The protruding portion 180 has substantially the same shape as the cylindrical wall portion 176 when looking from above, but is formed smaller than the cylindrical wall portion 176. As a result, when the heat dissipating plate 178 is attached to the case 164, the protruding portion 180 fits inside the cylindrical wall portion 176, and an inner peripheral surface 182 of the cylindrical wall portion 176 and an outer peripheral surface 184 of the protruding portion 180 are disposed facing each other in the radial direction of the cylindrical wall portion 176. In short, when the circuit assembly 160 is assembled, the cylindrical wall portion 176 is disposed outside the outer peripheral surface 184 of the protruding portion 180. The annular housing groove 90 that is open on its outer periphery side is formed in the outer peripheral surface 184 of the protruding portion 180, and the sealing member 22 in the form of an O-ring is accommodated inside the housing groove 90. A plurality of bolt holes 186 in which nuts (not illustrated) are embedded are formed in the protruding portion 180 at positions corresponding to the first and second bolt holes 168 and 170 of the annular flange 166.

The thermally conductive sheet 70 fixed to the lower surface of the semiconductor module 162 has substantially the same shape as the bottom surface of the semiconductor module 162 which includes the annular flange 166. Bolt holes 188 are formed in the thermally conductive sheet 70 at positions corresponding to the first and second bolt holes 168 and 170 of the annular flange 166.

Assembly Process of Circuit Assembly 160

First, a semiconductor module 162 with the heat conducting sheet 70 attached to its lower surface is prepared and inserted into the case 164 from below. As a result, the main body part 165 of the semiconductor module 162 become disposed through the opening hole 14 on the inside of the inner peripheral wall portion 76 of the case 164, and the annular flange 166 is placed from below in contact with the bottom wall 72 of the case 164. Next, the heat dissipating plate 178 is brought close to the case 164 from below, and the protruding portion 180 of the heat dissipating plate 178 is inserted inside the cylindrical wall portion 176 of the case 164. After this, the second bolts 190 are inserted and fastened in a state where the second bolt insertion holes 174, the second bolt holes 170, the bolt holes 188, and the bolt holes 186 have been placed in alignment.

As a result, the annular flange 166 becomes interposed in the vertical direction between the bottom wall 72, which is the peripheral edge portion of the opening hole 14, and the protruding portion 180 of the heat dissipating plate 178. The inner peripheral surface 182 of the cylindrical wall portion 176 and the outer peripheral surface 184 of the protruding portion 180 face each other in the radial direction of the cylindrical wall portion 176, and the sealing member 22 is interposed in a compressed state between the inner peripheral surface 182 of the cylindrical wall portion 176 and the outer peripheral surface 184 of the protruding portion 180 that face each other in the radial direction. As a result, in a gap between the cylindrical wall portion 176 and the protruding portion 180 that extends in the axial direction (that is, the vertical direction) of the cylindrical wall portion 176, a liquid-tight seal is produced in the form of a shaft seal by the sealing member 22. That is, in this fifth embodiment, the attached member that is attached to the case 164 and sandwiches the sealing member 22 in concert with the case 164 is composed of the heat dissipating plate 178.

Next, the bus bars 34 and the crimped terminals 42 are placed over the main circuit terminals 24 of the semiconductor module 12 and fixed by fastening the bolts 38. The insulating member 54 is then brought close to the semiconductor module 162 from above, and the first bolts 192 are inserted into the bolt insertion holes 64, the first bolt insertion holes 172, the first bolt holes 168, the bolt holes 188, and the bolt holes 186 and fastened. The control board 46 is also brought close to the insulating member 54 from above, and the bolts 94 are inserted through the bolt insertion holes 50 and the bolt holes 84 and fastened. This completes the circuit assembly 160 according to the fifth embodiment.

The circuit assembly 160 according to the fifth embodiment is attached to the housing 18 so that the lower surface of the heat dissipating plate 178 is placed over the housing 18. By doing so, heat generated at the semiconductor module 162 is dissipated from the housing 18 via the heat dissipating plate 178. In addition, at the peripheral edge portion of the opening hole 14, the sealing member 22 forms a liquid-tight seal at an intermediate position in the axial direction (vertical direction) of the part of the protruding portion 180 inserted into the cylindrical wall portion 176. As a result, infiltration of water from the outside into the inside through the opening hole 14 is prevented.

In the circuit assembly 160 according to the fifth embodiment, the annular flange 166 fits inside the cylindrical wall portion 176 of the case 164 and the annular flange 166 is placed over the bottom wall 72 of the case 164 from below. Also, the protruding portion 180 of the heat dissipating plate 178 is inserted inside the cylindrical wall portion 176 from below the semiconductor module 162 and is placed over the lower surface (the heat conductive sheet 70) of the semiconductor module 162. By doing so, the semiconductor module 162 is horizontally and vertically positioned with respect to the case 164, and the heat dissipating plate 178 is horizontally positioned with respect to the case 164. As a result, the efficiency of assembly of the circuit assembly 160 is improved.

Other Embodiments

The technology according to the present disclosure is not limited to the embodiments described above and illustrated in the drawings, and the technical scope of the present disclosure also includes other embodiments such as those described below.

Figure 14:
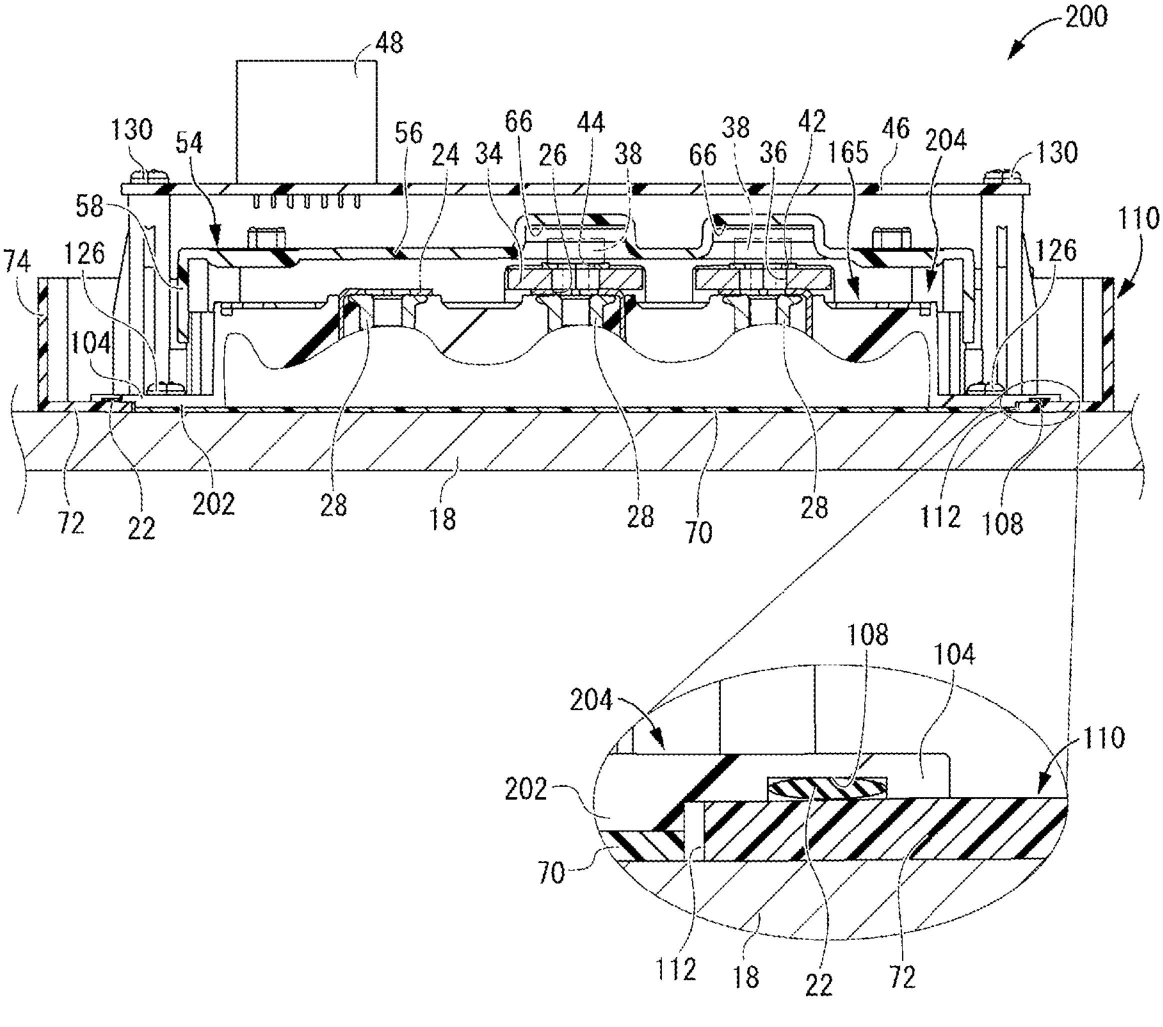
FIG. 14 is a vertical cross-sectional view of a circuit assembly according to another aspect of the present disclosure and corresponds to FIG. 4.

(1) Although the housing 18 is provided with the contact protrusion 142 and the contact protrusion 142 fits inside the opening hole 112 and makes thermal contact with the semiconductor module 102 in the third embodiment described above, like a circuit assembly 200 depicted in FIG. 14, a contact protrusion 202 that contacts the housing 18 may be provided on a semiconductor module 204, which is a heat generating component. In more detail, the semiconductor module 204 is provided with a flange 104 that protrudes on both sides in the front-rear direction and the left-right direction and the contact protrusion 202 that is substantially annular is provided on the lower surface of this flange 104. The outer diameter dimension of the contact protrusion 202 is smaller than the inner diameter dimension of the opening hole 112. A substrate, which is made of metal for example, of the semiconductor module 204 is disposed on the inside of this annular contact protrusion 202. With this configuration, when the circuit assembly 200 is assembled, the contact protrusion 202 and the metal substrate of the semiconductor module 204 fit inside the opening hole 112 and can make thermal contact with the housing 18 which is flat. In short, in the semiconductor module 204, by providing the flange 104 that is a predetermined amount higher than the lower end of the semiconductor module 204, it is possible to insert the main body part 165 of the semiconductor module 204 into the opening hole 112 in a state where the flange 104 contacts the bottom wall 72 of the case 110, which is the peripheral edge portion of the opening hole 112, from above. This means that the semiconductor module 204 can be placed in contact, for example via the heat conductive sheet 70, with the flat housing 18 that is not formed in a special shape.

(2) Although the heat generating components in the embodiments described above are the semiconductor modules 12, 102, and 162, the heat generating components may be relays or fuses. If the heat generating component is a relay or a fuse, the housing of the relay or the fuse may be exposed to the outside through an opening hole in the case and come into thermal contact with a heat dissipator, or a bus bar fixed to a connector of the relay or fuse may be exposed to the outside through an opening hole in the case and contact a heat dissipator.

(3) Although parts of the sealing member 22 are interposed between the flange 104 and the peripheral edge portion (that is, the bottom wall 72) of the opening hole 112 in the second embodiment, the entire sealing member may be interposed between an annular flange and a peripheral edge part of the opening hole.

(4) Although the insulating member 54 is fixed to the case and the heat dissipating plate by bolts in the embodiments described above, the method of fixing the insulating member to the case is not limited to bolts. As one example, the peripheral wall of the case may be provided with a hook portion that protrudes inward and the insulating member may engage this hook portion when the insulating member has ridden over the hook portion, thereby fixing the insulating member to the case.

(5) Although the thermally conductive sheet 70 is attached to the lower surface of the heat generating component (which is the semiconductor module 12, 102, or 162) in the embodiments described above, the thermally conductive sheet 70 may be attached to the heat dissipating plate or the housing instead of the lower surface of the heat generating component. Note that when the housing of a heat generating component, such as a relay or a fuse, is made of synthetic resin, or even in the case of a semiconductor module, when the lower surface is covered with a synthetic resin material, a thermally conductive sheet will not be essential.

(6) As one example, in the first embodiment, the sealing member 22 is composed of an O-ring that is made of rubber or the like and is circular (that is, O-shaped) in cross section. However, the sealing member 22 may be an annular elastic body with a non-circular cross-section, such as a D ring, an X ring, or a T ring or liquid packing. Also, although the housing groove 90 that houses the sealing member 22 is provided on the heat dissipating plate 20 in the first embodiment, in place of or in addition to the heat dissipating plate, it is also possible to provide a housing groove in a bottom wall of the case that faces the heat dissipating plate. In the same way, in the second and third embodiments, the housing groove may be provided on the bottom wall of the case that faces the flange in the vertical direction, and in the fifth embodiment, the housing groove may be provided in the cylindrical wall portion of the case that faces the protruding portion of the heat dissipating plate in the horizontal direction.

LIST OF REFERENCE NUMERALS

10 Circuit assembly (first embodiment)
12 Semiconductor module (or "heat generating component")
14 Opening hole
16 Case
18 Housing (or "heat dissipator")
20 Heat dissipating plate (or "attached member")
22 Sealing member
24 Main circuit terminal
26 Bolt hole
28 Nut
30 Control terminal
32 Upward protrusion
33 Positioning recess
34 Bus bar
36 Bolt insertion hole
38 Bolt
40 Electric wire
42 Crimped terminal
44 Bolt hole
46 Control board
48 Connector
50 Bolt insertion hole
52 Through hole
54 Insulating member
56 Upper bottom wall portion
58 Peripheral wall portion
60 Through hole
62 Downward protrusion
64 Bolt insertion hole
66 Housing recess
68 Electric wire insertion hole
70 Thermally conductive sheet (or "thermally conductive member")
72 Bottom wall (or "peripheral edge portion")
74 Peripheral wall
75 Positioning protrusion
76 Inner peripheral wall portion
78 Outer peripheral wall portion
80 Intermediate wall portion
82 Bolt insertion hole
84 Bolt hole
86 Bolt insertion hole
88 Cap nut
90 Housing groove
92, 94 Bolt
100 Circuit assembly (second embodiment)
102 Semiconductor module (or "heat generating component" or "attached member")
104 Flange
106 Bolt hole
108 Housing groove
110 Case
112 Opening hole
114 Inner periphery bolt hole
116 Outer periphery bolt hole
118 Heat dissipating plate
120 Contact protrusion
122 Bolt hole
124 Bolt hole
126, 128, 130 Bolt
140 Circuit assembly (third embodiment)
142 Contact protrusion
150 Circuit assembly (fourth embodiment)
152 Case
154 Heat dissipating plate (or "attached member")
156 Dissimilar bonding material (or "sealing member")
160 Circuit assembly (fifth embodiment)
162 Semiconductor module (or "heat generating component")
164 Case
165 Main body part
166 Annular flange
168 First bolt hole
170 Second bolt hole
172 First bolt insertion hole
174 Second bolt insertion hole
176 Cylindrical wall portion
178 Heat dissipating plate (or "attached member")
180 Protruding portion
182 Inner peripheral surface (of the cylindrical wall portion)
184 Outer peripheral surface of the protruding portion
186 Bolt hole
188 Bolt hole
190 Second bolt
192 First bolt
200 Circuit assembly (see FIG. 14)
202 Contact protrusion
204 Semiconductor module (or "heat generating component")

The invention claimed is:

1. A circuit assembly comprising:

a case including an opening hole at a bottom thereof;

a heat generating component that is housed inside the case, is exposed to the outside through the opening hole, and is in thermal contact with an external heat dissipator; and an annular sealing member that is disposed at a peripheral edge portion of the opening hole and is interposed between the case and an attached member that is attached to the case and contacts the external heat dissipator; and an electrically insulating member that covers the heat generating component from above, wherein the heat generating component and the case are interposed between the insulating member and the attached member in a vertical direction, the insulating member, the heat generating component, the case and the attached member are fixed in the vertical direction by at least one nut and at least one bolt passing at least the insulating member, the case and the attached member and fastened to the at least one nut, the insulating member includes at least one downward protrusion, the heat generating component includes at least one upward protrusion, and the at least one downward protrusion of the insulating member and the at least one upward protrusion of the heat generating component face each other to restrict movement of the heat generating component in the vertical direction.

2. The circuit assembly according to claim 1, wherein the attached member includes a heat dissipating plate that covers the opening hole and is made of a material with higher thermal conductivity than the case, wherein the heat generating component is mounted in thermal contact with an inner surface of the heat dissipating plate, and an outer surface of the heat dissipating plate is in thermal contact with the external heat dissipator.

3. The circuit assembly according to claim 2, wherein a housing groove for housing the sealing member is formed in the inner surface of the heat dissipating plate, and the sealing member is interposed between the heat dissipating plate and a bottom surface of the case, which is mounted on the housing groove.

4. The circuit assembly according to claim 2, wherein the case and the heat dissipating plate are integrally formed, and the sealing member interposed between the peripheral edge portion of the opening hole in the case and the heat dissipating plate is provided by a dissimilar bonding material.

5. The circuit assembly according to claim 2, wherein the heat dissipating plate includes a protruding portion that protrudes toward the heat generating component, the case includes a cylindrical wall portion disposed on an outside of an outer peripheral surface of the protruding portion, and the sealing member is interposed between an inner peripheral surface of the cylindrical wall portion and an outer peripheral surface of the protruding portion that are disposed facing each other in a radial direction of the cylindrical wall portion.

6. The circuit assembly according to claim 5, wherein an annular flange protrudes on an outer peripheral edge of the heat generating component, and the annular flange is interposed between the peripheral edge portion of the opening hole and the protruding portion of the heat dissipating plate.

7. A circuit assembly comprising:

a case including an opening hole at a bottom thereof;

a heat generating component that is housed inside the case, is exposed to the outside through the opening hole, and is in thermal contact with an external heat dissipator; and an annular sealing member that is disposed at a peripheral edge portion of the opening hole and is interposed between the case and an attached member that is attached to the case and contacts the external heat dissipator; and an electrically insulating member that covers the heat generating component from above, wherein the heat generating component and the case are interposed between the insulating member and the attached member in a vertical direction, the insulating member, the heat generating component, the case and the attached member are fixed in the vertical direction by at least one nut and at least one bolt passing at least the insulating member, the case and the attached member and fastened to the at least one nut, and the case includes a peripheral wall extending upward from the bottom and having a triple-wall structure with three walls that are separated in a radial direction.

8. The circuit assembly according to claim 7, wherein the insulating member includes an upper bottom wall and a peripheral wall portion that protrudes downward from the upper bottom wall, the peripheral wall portion covers an innermost wall of the three walls of the peripheral wall of the case from the outside of the innermost wall.

* * * * *